(12) United States Patent
Ichimura et al.

(10) Patent No.: US 10,141,397 B2
(45) Date of Patent: Nov. 27, 2018

(54) SEMICONDUCTOR DEVICE AND METHOD OF MANUFACTURING THE SAME

(71) Applicant: Renesas Electronics Corporation, Tokyo (JP)

(72) Inventors: Akio Ichimura, Ibaraki (JP); Satoshi Eguchi, Ibaraki (JP); Tetsuya Iida, Ibaraki (JP); Yuya Abiko, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/700,669

(22) Filed: Sep. 11, 2017

(65) Prior Publication Data

US 2018/0012959 A1    Jan. 11, 2018

Related U.S. Application Data

(62) Division of application No. 14/968,004, filed on Dec. 14, 2015, now Pat. No. 9,786,735.

(30) Foreign Application Priority Data

Mar. 11, 2015    (JP) .................................. 2015-048613

(51) Int. Cl.
*H01L 29/66*    (2006.01)
*H01L 29/06*    (2006.01)
(Continued)

(52) U.S. Cl.
CPC .... *H01L 29/0634* (2013.01); *H01L 29/66712* (2013.01); *H01L 29/7811* (2013.01);
(Continued)

(58) Field of Classification Search
CPC .......... H01L 29/0634; H01L 29/66712; H01L 29/7811; H01L 29/1095; H01L 29/404; H01L 29/41766; H01L 29/66727
See application file for complete search history.

(56) References Cited

U.S. PATENT DOCUMENTS

2008/0303114 A1* 12/2008 Shibata ............... H01L 29/0634
257/495
2009/0079002 A1* 3/2009 Lee ..................... H01L 29/0634
257/355
(Continued)

FOREIGN PATENT DOCUMENTS

JP    2007-12858 A    1/2007
JP    2009-147234 A    7/2009
(Continued)

OTHER PUBLICATIONS

Japanese Office Action received in corresponding Japanese Application No. 2015-048613 dated Sep. 4, 2018.

*Primary Examiner* — Mark Tornow
(74) *Attorney, Agent, or Firm* — Mattingly & Malur, PC

(57) ABSTRACT

A super junction structure having a high aspect ratio is formed. An epitaxial layer is dividedly formed in layers using the trench fill process, and when each of the layers has been formed, trenches are formed in that layer. For example, when a first epitaxial layer has been formed, first trenches are formed in the epitaxial layer. Subsequently, when a second epitaxial layer has been formed, second trenches are formed in the epitaxial layer. Subsequently, when a third epitaxial layer has been formed, third trenches are formed in the third epitaxial layer.

5 Claims, 27 Drawing Sheets

(51) Int. Cl.
  *H01L 29/78*  (2006.01)
  *H01L 29/10*  (2006.01)
  *H01L 29/40*  (2006.01)
  *H01L 29/417*  (2006.01)

(52) U.S. Cl.
  CPC ........ *H05K 999/99* (2013.01); *H01L 29/1095* (2013.01); *H01L 29/404* (2013.01); *H01L 29/41766* (2013.01); *H01L 29/66727* (2013.01)

(56) References Cited

U.S. PATENT DOCUMENTS

| | | | |
|---|---|---|---|
| 2009/0294917 A1* | 12/2009 | Yajima | H01L 23/544 |
| | | | 257/622 |
| 2009/0321819 A1* | 12/2009 | Kagata | H01L 29/0634 |
| | | | 257/330 |
| 2014/0191309 A1 | 7/2014 | Eguchi | |
| 2014/0231912 A1 | 8/2014 | Willmeroth | |
| 2015/0115333 A1 | 4/2015 | Bobde | |

FOREIGN PATENT DOCUMENTS

| | | |
|---|---|---|
| JP | 2010-109033 A | 5/2010 |
| JP | 2012-60017 A | 3/2012 |

\* cited by examiner

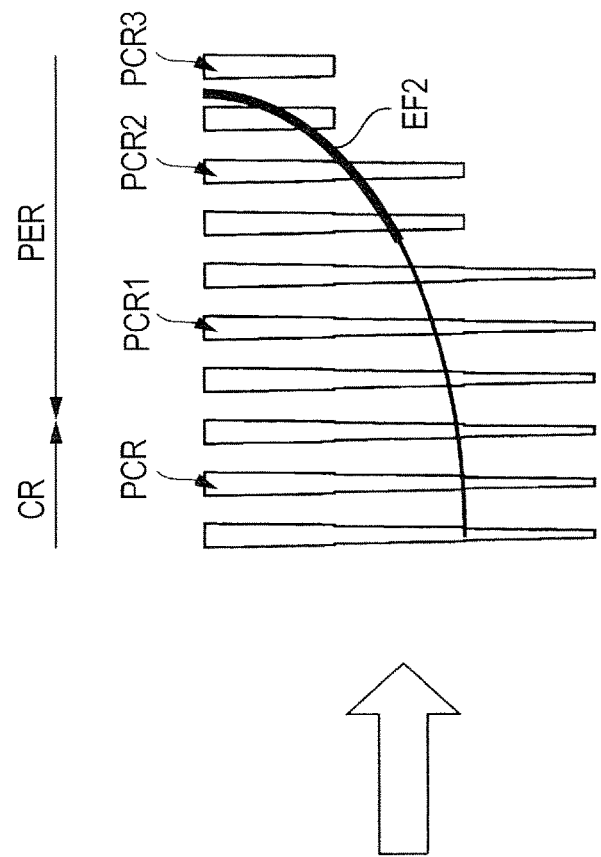
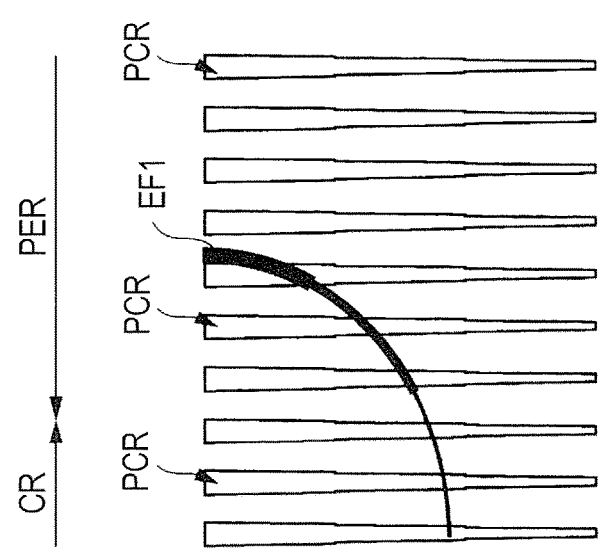

SEMICONDUCTOR DEVICE AND METHOD OF MANUFACTURING THE SAME

CROSS-REFERENCE TO RELATED APPLICATIONS

This application is a divisional application of U.S. Ser. No. 14/968,004, filed Dec. 14, 2015, the disclosure of Japanese Patent Application No. 2015-048613 filed on Mar. 11, 2015 including the specification, drawings and abstract is incorporated herein by reference in its entirety.

BACKGROUND

The present invention relates to a semiconductor device and a technique for manufacturing the semiconductor device. For example, the invention relates to a technology effectively applied to a semiconductor device including a power transistor having what is called a super junction structure, and to a technique for manufacturing the semiconductor device.

Japanese Unexamined Patent Application Publication No. 2010-109033 describes a technology on a power transistor having the super junction structure.

SUMMARY

For example, the power transistor having the super junction structure includes an epitaxial layer having a periodical structure including p-type column regions and n-type column regions. In the off state of such a power transistor having the super junction structure, a depletion layer also extends in a lateral direction from a pn junction formed in a boundary region between the p-type column region and the n-type column region. In the power transistor having the super junction structure, therefore, even if the impurity concentration of the n-type column region (epitaxial layer) as a current path is high, depletion layers extend from two boundary regions toward the inside of the n-type column region sandwiched by the boundary regions and are eventually connected together, and thus the entire n-type column region is likely to be depleted.

This results in depletion of the entire n-type column region (the entire epitaxial layer) in the off state, leading to a sufficient withstand voltage. In other words, the power transistor having the super junction structure is allowed to deplete the entire n-type column region despite the high impurity concentration of the n-type column region as the current path. As a result, the power transistor having the super junction structure is allowed to reduce its on-resistance while having a high withstand voltage.

In this regard, since the power transistor having the super junction structure has a higher withstand voltage with a larger depth of each of the p-type column region and the n-type column region, a larger thickness of the epitaxial layer is desired in light of providing a sufficient withstand voltage. In addition, as a cell is further shrunk, the impurity concentration of the n-type column region (epitaxial layer) is increased; hence, the cell is desirably shrunk in light of lowering of on resistance.

Examples of a manufacturing technique for forming the super junction structure includes a manufacturing technique of a what is called "trench fill process", in which a trench is formed in the epitaxial layer, and then the trench is filled with a semiconductor material to form the p-type column region.

To note the trench fill process, the aspect ratio of the trench is large in each of the case of forming the p-type column region having a large depth and the case of shrinking the cell, showing a high technical difficulty for forming the p-type column region by the trench fill process. Hence, when the super junction structure is formed by the trench fill process, a consideration must be made to achieve a further increase in withstand voltage or a further reduction in on resistance.

Other issues and novel features will be clarified from the description of this specification and the accompanying drawings.

According to one embodiment of the invention, there is provided a semiconductor device having a level difference in each of boundary regions between second-conductivity-type column regions and first-conductivity-type column regions being alternately disposed.

According to one embodiment of the invention, there is provided a method of manufacturing a semiconductor device, in which an epitaxial layer is dividedly formed in partial layers in a plurality of steps assuming use of the trench fill process, and when each of the partial layers has been formed, trenches are formed in that partial layer and filled with a semiconductor material.

According to the respective embodiments, a super junction structure having a high aspect ratio can be formed.

BRIEF DESCRIPTION OF THE DRAWINGS

FIG. 24A is a schematic illustration of a super junction structure, in which respective bottom positions of a plurality of p-type column regions provided in a peripheral region are equal to bottom positions of a plurality of p-type column regions provided in a cell region.

FIG. 24B is a schematic illustration of the super junction structure of the third embodiment.

DETAILED DESCRIPTION

Although each of the following embodiments may be dividedly described in a plurality of sections or embodiments for convenience as necessary, they are not unrelated to one another except for the particularly defined case, and are in a relationship where one is a modification, a detail, supplementary explanation, or the like of part or all of another one.

In each of the following embodiments, when the number of elements and the like (including the number, a numerical value, amount, and a range) are mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step etc.) of the embodiment is not necessarily indispensable except for the particularly defined case and for the case where the constitutional element is probably indispensable in principle.

Similarly, in each of the following embodiments, when configurations such as a shape of a constitutional element and a positional relationship are described, any configuration substantially closely related to or similar to one of those configurations should be included except for the particularly defined case and for the case where that configuration is probably not included in principle. The same holds true in each of the numerical value and the range.

In all drawings for explaining the following embodiments, the same components are designated by the same numeral, and duplicated description is omitted. A plan diagram may also be hatched for better viewability.

First Embodiment

Typical Super Junction Structure

Figure 1:
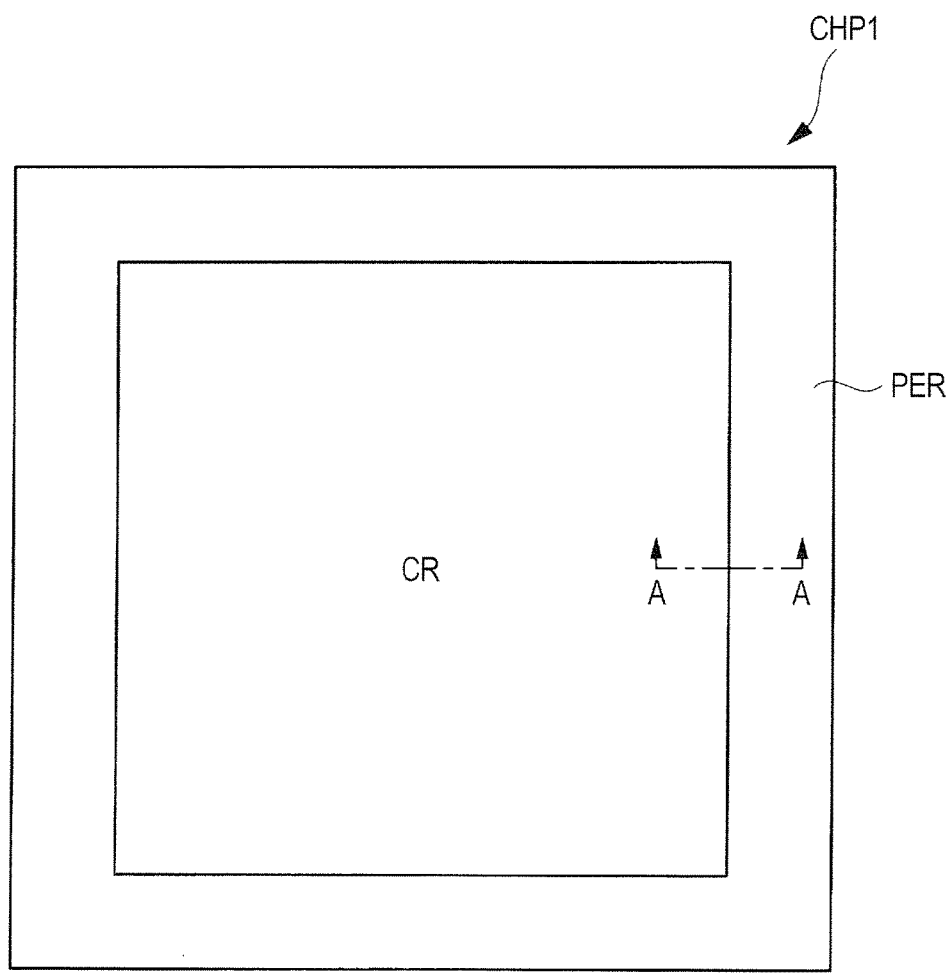
FIG. 1 is a schematic illustration of a planar configuration of a semiconductor chip having a power MOSFET.

The first embodiment is described with a power metal oxide semiconductor field effect transistor (MOSFET) as an exemplary power semiconductor element. FIG. 1 is a schematic illustration of a planar configuration of a semiconductor chip CHP1 having a power MOSFET. As illustrated in FIG. 1, for example, the semiconductor chip CHP1 has a rectangular shape, and includes a cell region CR and a peripheral region PER (termination region). In addition, as illustrated in FIG. 1, the cell region CR is disposed inside of the peripheral region PER. In other words, the peripheral region PER is disposed outside of the cell region CR. To put it differently, the peripheral region PER is disposed so as to enclose the outer side of the cell region CR. Conversely, the cell region CR is disposed in an inner region enclosed by the peripheral region PER.

For example, the cell region CR has a plurality of power MOSFETs each serving as a switching element. For example, the peripheral region PER has a peripheral structure typified by a bevel structure having an obliquely etched periphery, a diffused ring structure, a field ring structure, or a field plate structure. Such a peripheral structure is basically provided based on a design idea of suppressing the avalanche breakdown phenomenon caused by electric field concentration. As described above, for the semiconductor chip CHP1, the power MOSFETs are provided in the inner region including a central region, and the peripheral structure as an electric-field relaxation structure is provided in the outer region enclosing the inner region.

Figure 2:
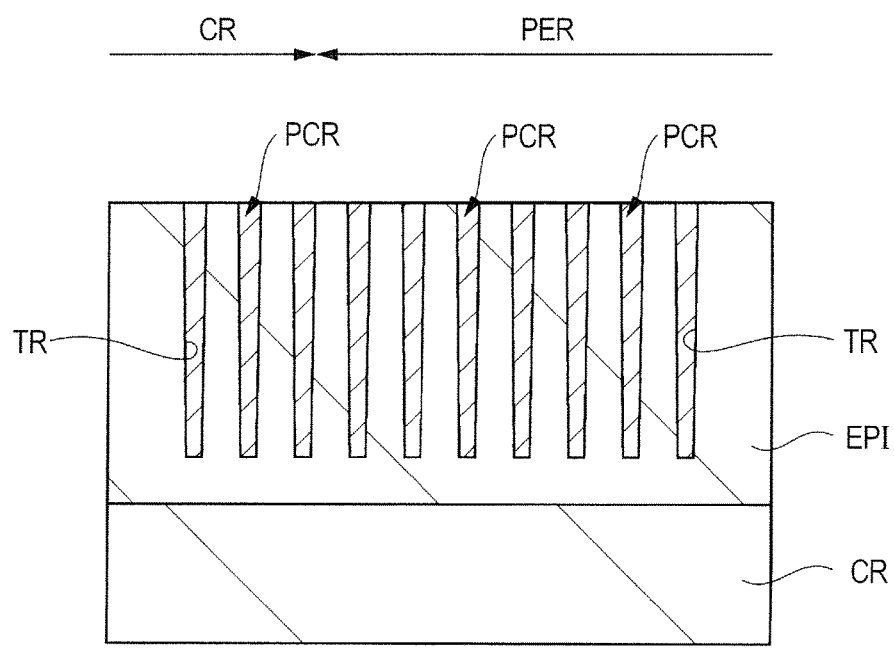
FIG. 2 illustrates a typical super junction structure in a section cut along a line A-A in FIG. 1.

FIG. 2 illustrates a typical super junction structure in a section cut along a line A-A in FIG. 1. As illustrated in FIG. 2, the semiconductor chip CHP includes the cell region CR and the peripheral region PER. In FIG. 2, for example, an epitaxial layer EPI is provided on a semiconductor substrate 1S including silicon containing an n-type impurity such as phosphor (P) or arsenic (As). The epitaxial layer EPI is configured of a semiconductor layer mainly containing silicon doped with the n-type impurity such as phosphor (P) or arsenic (As), for example. The semiconductor substrate 1S and the epitaxial layer EPI configure a drain region of the power MOSFET.

A plurality of p-type column regions PCR are provided in the epitaxial layer EPI while being separated from each other. For example, each of the p-type column regions PCR has a pillar shape, and is configured of a semiconductor region doped with a p-type impurity such as boron (B). A partial region of the epitaxial layer EPI sandwiched by the p-type column regions adjacent to each other may be referred to as n-type column region (n-type column region NCR, see FIG. 4). In other words, the p-type column regions PCR and the n-type column regions are alternately disposed in the epitaxial layer EPI on the semiconductor substrate 1S. This structure is referred to as super junction structure. While not shown in FIG. 2, an element section is provided on the surface of the epitaxial layer EPI having the super junction structure.

Technique for Manufacturing Super Junction Structure

A technique for manufacturing the super junction structure is now described. Examples of the technique for manufacturing the super junction structure include a process called "multi-epitaxial process" and a process called "trench fill process".

In the multi-epitaxial process, the epitaxial layer EPI, in which the p-type column regions PCR are to be provided, is dividedly formed in layers in a plurality of steps, and a p-type impurity is introduced into each of the layers by an ion implantation process.

In the trench fill process, the entire epitaxial layer EPI is formed, and then a trench is formed in the epitaxial layer EPI, and the trench is filled with a p-type semiconductor material, thereby the p-type column region PCR is formed.

Investigation for Improvement

In the first embodiment, the trench fill process is noted as a technique for manufacturing the super junction structure, and a consideration is made to further increase the withstand voltage of the super junction structure by the trench fill process. In particular, although a larger depth of the trench is effective in increasing the withstand voltage, if the trench is increased in depth with its width being roughly maintained, the trench is increased in aspect ratio defined by the ratio of the depth to the width of the trench. This degrades the filling properties of the trench, leading to an increase in difficulty of the trench. In the first embodiment, therefore, a consideration is given to manufacturing of a trench having a virtually high aspect ratio while the trench fill process is used as a technique for manufacturing the super junction structure. The technical idea of the first embodiment, in which such a consideration is made, is now described.

Basic Idea of First Embodiment

For example, FIG. 2 illustrates a super junction structure having a maximum aspect ratio of a trench TR in a range of a producible aspect ratio. In this configuration shown in FIG. 2, since the aspect ratio exceeds the producible range, it is difficult to further increase the thickness of the epitaxial layer EPI and to increase the depth of the trench TR further in order to further increase the withstand voltage.

Figure 3:
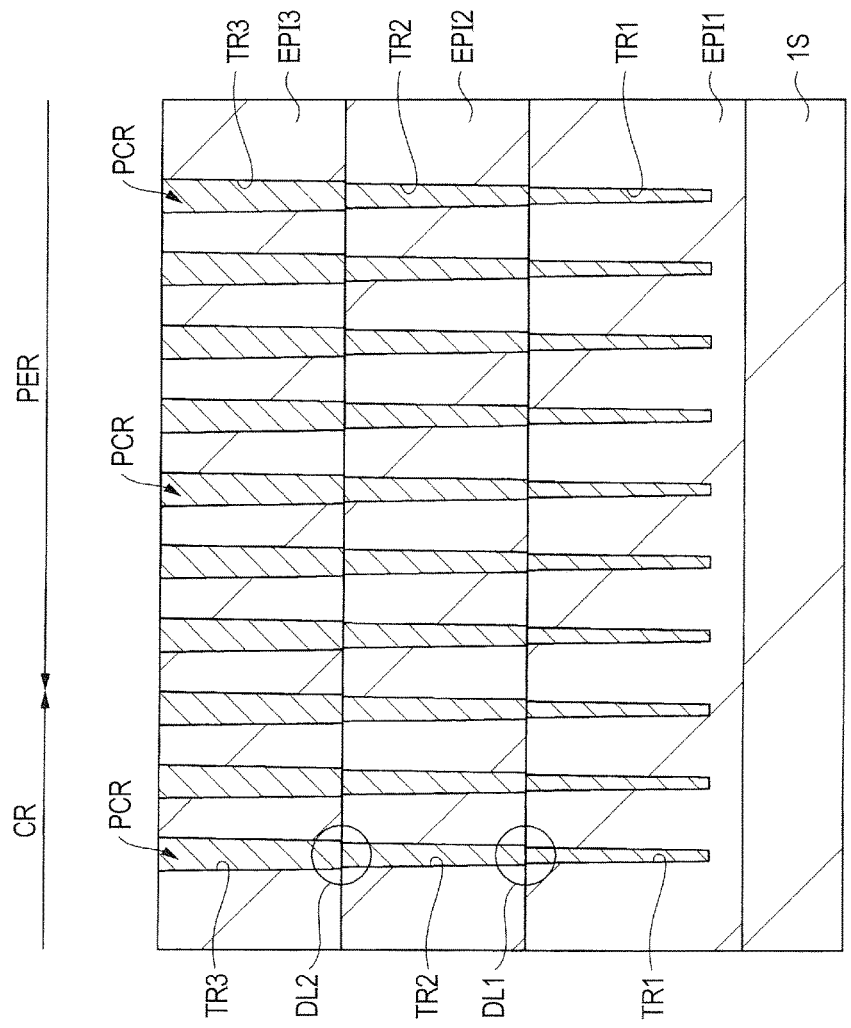
FIG. 3 is a sectional view illustrating a super junction structure of a first embodiment.

In the first embodiment, therefore, a consideration is given to manufacturing of a trench having an aspect ratio that is virtually higher than that of the typical super junction structure illustrated in FIG. 2. Specifically, FIG. 3 is a sectional view illustrating the super junction structure of the first embodiment. The basic idea of the first embodiment shown in FIG. 3 is a technical idea that the epitaxial layer EPI is dividedly formed in layers using the trench fill process, and when each of the layers has been formed, trenches is formed in that layer. Specifically, for example, as illustrated in FIG. 3, when an epitaxial layer EPI1 has been formed, trenches TR1 are formed in the epitaxial layer EPI1. Subsequently, when an epitaxial layer EPI2 has been formed, trenches TR2 are formed in the epitaxial layer EPI2. Subsequently, when an epitaxial layer EPI3 has been formed, trenches TR3 are formed in the epitaxial layer EPI3. In particular, in the first embodiment, the trenches TR1, TR2, and TR3 are formed so as to be planarly superposed on one another while being connected together.

Consequently, while the aspect ratio of each of the trenches TR1 to TR3 illustrated in FIG. 3 is set within the producible range similar to that of the aspect ratio of the trench TR illustrated in FIG. 2, the aspect ratio of the entire trench (TR1+TR2+TR3) as a combination of the trenches TR1 to TR3 can be made higher than an aspect ratio allowed for formation of the trench in a single epitaxial layer. In other words, the aspect ratio of the entire trench (TR1+TR2+TR3) as a combination of the trenches TR1 to TR3 can be made higher than the aspect ratio of the trench TR illustrated in FIG. 2. This means that the first embodiment allows the depth of the trench to be further increased, making it possible to further increase the withstand voltage of the super junction structure.

Configuration of Element Section

Figure 4:
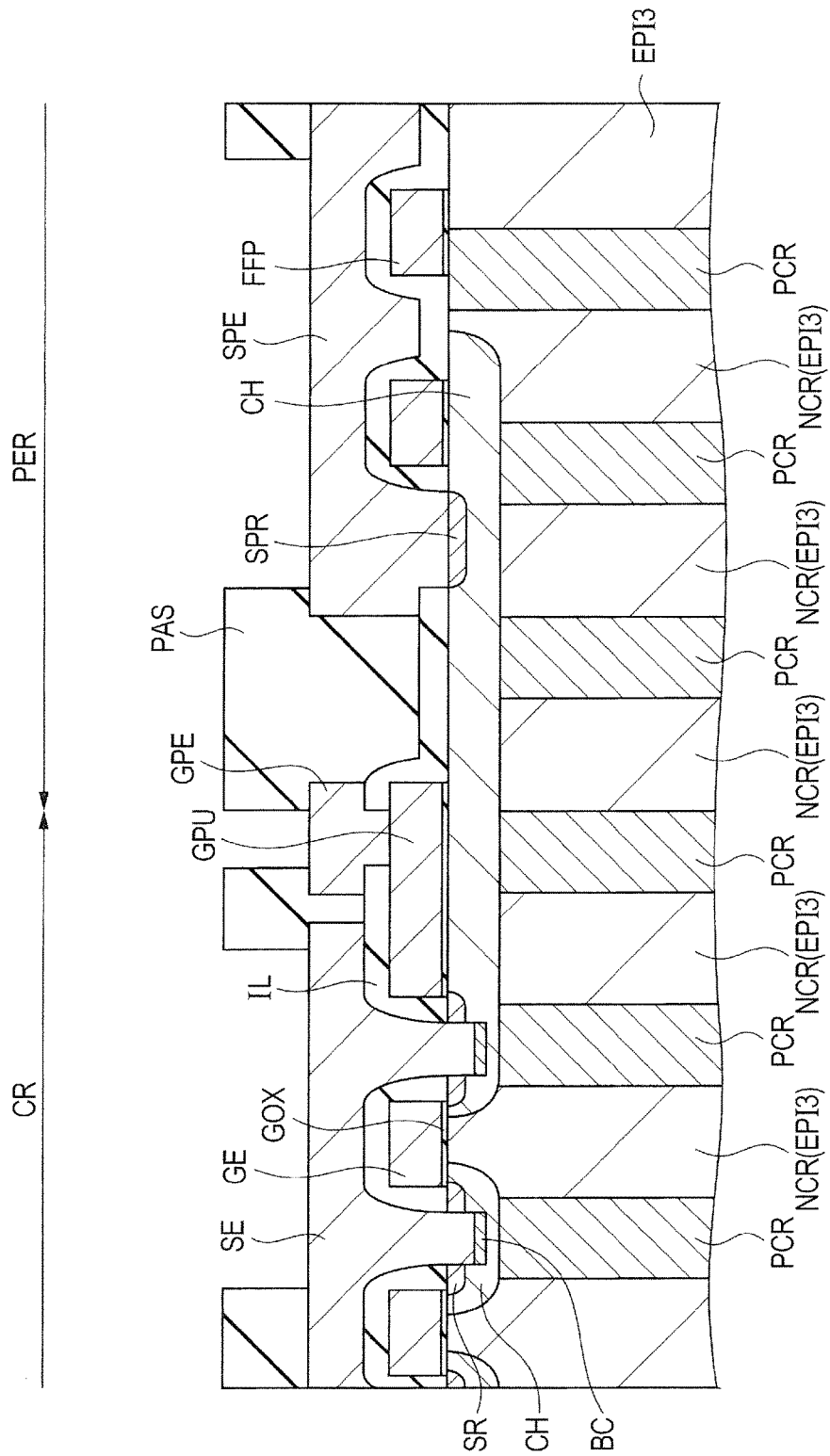
FIG. 4 is a sectional view illustrating a configuration of an element section provided on the super junction structure of the first embodiment illustrated in FIG. 3.

A configuration of the element section provided on the super junction structure of the first embodiment illustrated in FIG. 3 is now described. FIG. 4 is a sectional view illustrating a configuration of the element section provided on the super junction structure of the first embodiment illustrated in FIG. 3.

First, a device structure of the cell region CR is described. In FIG. 4, the element section has a channel region CH in contact with the p-type column region PCR in the surface of the epitaxial layer EPI3, and a source region SR is provided so as to be enveloped by the channel region CH. The channel region CH is configured of a semiconductor region doped with a p-type impurity such as boron (B). The source region SR is configured of a semiconductor region doped with an n-type impurity such as phosphor (P) or arsenic (As).

A gate insulating film GOX is provided on a region sandwiched by the channel regions CH adjacent to each other, and a gate electrode GE is provided on the gate insulating film GOX. The gate insulating film GOX is formed of, for example, a silicon oxide film, but may be formed of, for example, a high-dielectric film having a dielectric constant higher than that of the silicon oxide film. The gate electrode GE is formed of, for example, a polysilicon film. The gate electrode GE is provided so to match with the source region SR. An interlayer insulating film IL configured of, for example, a silicon oxide film is provided so as to cover the top and the two sidewalls of the gate electrode GE.

A trench is provided in the surface of a region exposed from the interlayer insulating film IL between the gate electrodes GE adjacent to each other while running up to the channel region CH through the source region SR. A body contact region BC is provided on the bottom of the trench. The body contact region BC is configured of a semiconductor region doped with a p-type impurity such as boron (B), and has an impurity concentration higher than that of the channel region CH.

A barrier conductor film including, for example, a titanium-tungsten film and a source electrode SE including, for example, an aluminum alloy film are provided over the interlayer insulating film IL covering the gate electrodes GE while filling the trench having the body contact region BC on its bottom. Consequently, the source electrode SE is electrically coupled to the source region SR and to the channel region CH via the body contact region BC.

The body contact region BC has a function of providing ohmic contact with the source electrode SE, and allows the source region SR and the channel region CH to be electrically coupled to each other with the same potential.

Hence, it is possible to suppress on operation of a parasitic npn bipolar transistor with the source region SR as an emitter region, the channel region CH as a base region, and the epitaxial layer EPI3 as a collector region. Specifically, the electrical coupling of the source region SR and the channel region CH with the same electric potential means no difference in electric potential between the emitter region and the base region of the parasitic npn bipolar transistor, leading to suppress of on operation of the parasitic npn bipolar transistor.

A gate lead section GPU including the polysilicon film as the same layer as the gate electrode GE is provided, with the gate insulating film GOX in between, on the channel region CH provided in the epitaxial layer EPI3 within the cell region CR near the boundary with the peripheral region PER. The interlayer insulating film IL is provided so as to cover the top and the two sidewalls of the gate lead section GPU, and partially has an opening that exposes part of the top of the gate lead section GPU. A gate lead electrode GPE is provided on the interlayer insulating film IL including the inside of the opening. The gate lead section GPU is electrically coupled to a plurality of gate electrodes GE. A gate voltage applied to the gate lead electrode GPE is applied to each of the gate electrodes GE via the gate lead section GPU.

A surface protective film PAS including, for example, a silicon oxide film is provided so as to partially cover the source electrode SE and the gate lead electrode GPE. Part of the source electrode SE and part of the gate lead electrode GPE are exposed from the surface protective film PAS. In this way, a plurality of power MOSFETs are provided in the cell region CR.

A structure of the peripheral region PER provided outside of the cell region CR is now described. As illustrated in FIG. 4, as with the cell region CR, the peripheral region PER is also designed such that a plurality of p-type column regions PCR are provided in the epitaxial layer EPI3 while being separated from each other. The channel region CH is provided in the surface of the epitaxial layer EPI3 while extending from the cell region CR, and a source lead region SPR is provided so as to be enveloped within the channel region CH. A plurality of electrodes FFP, which each includes the polysilicon film as the same layer as the gate electrode GE provided in the cell region CR, are provided on the surface of the epitaxial layer EPI3.

The interlayer insulating film IL is provided on the epitaxial layer EPI3 so as to cover the top and the two sidewalls of each of the electrodes FFP. An opening is provided in the interlayer insulating film IL so as to expose the source lead region SPR. A barrier conductor film including, for example, a titanium-tungsten film and a source lead electrode SPE including, for example, an aluminum alloy film are provided over the interlayer insulating film IL that fills the opening and covers the electrodes FFP.

The peripheral region PER is also designed such that the surface protective film PAS including, for example, a silicon oxide film is provided so as to partially cover the source lead electrode SPE, and part of the source lead electrode SPE is exposed from the surface protective film PAS. In this way, a peripheral structure is provided in the peripheral region PER.

Method of Manufacturing Semiconductor Device of First Embodiment

A method of manufacturing the semiconductor device of the first embodiment configured as described above is now described with reference to drawings.

Figure 5:
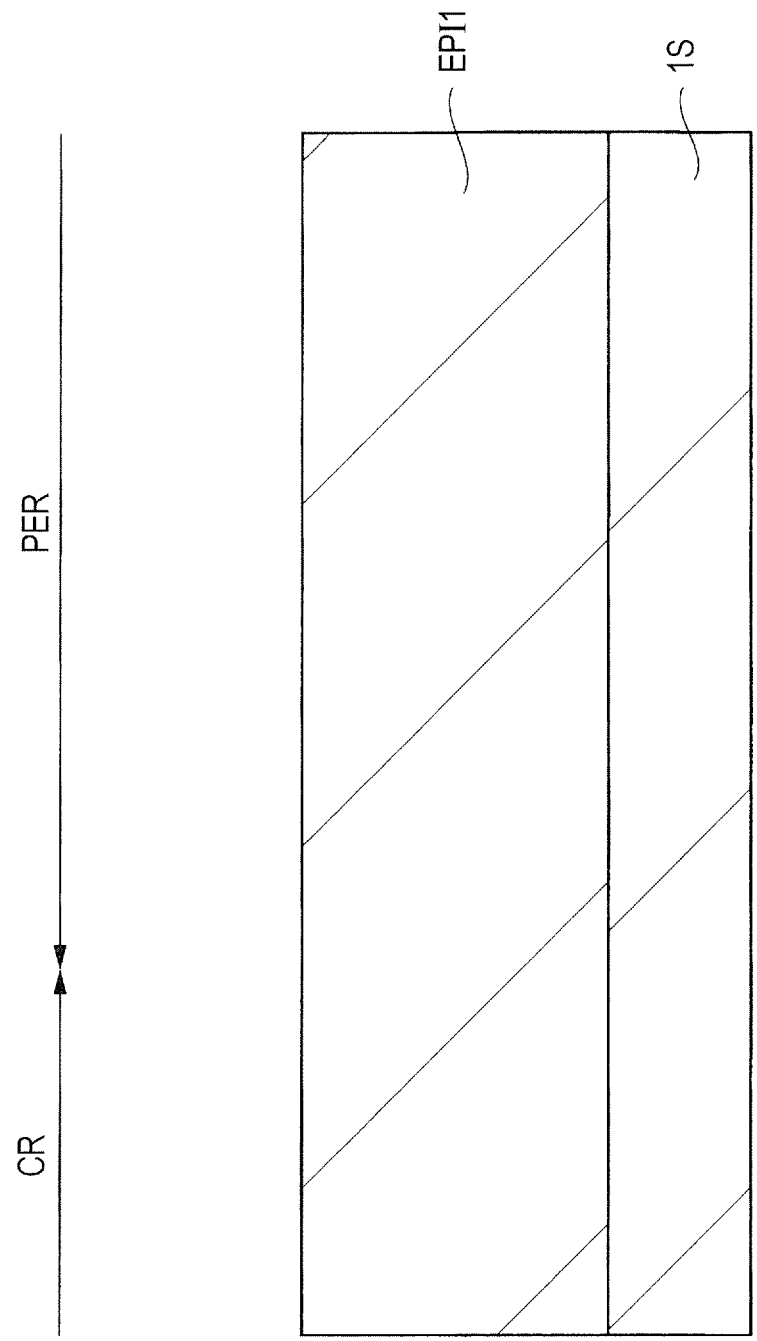
FIG. 5 is a sectional view illustrating a manufacturing process of a semiconductor device of the first embodiment.

As illustrated in FIG. 5, for example, the semiconductor substrate (silicon substrate) 1S doped with an n-type impurity is provided, and the epitaxial layer (silicon layer) EPI1 doped with the n-type impurity is formed on the semiconductor substrate 1S using an epitaxial process. A hard mask film including, for example, a silicon oxide film is then formed on the epitaxial layer EPI, and a resist film is formed on the hard mask film. Subsequently, the resist film is patterned using a photolithography technique. Subsequently, the hard mask film is patterned by etching with the patterned resist film as a mask.

Figure 6:
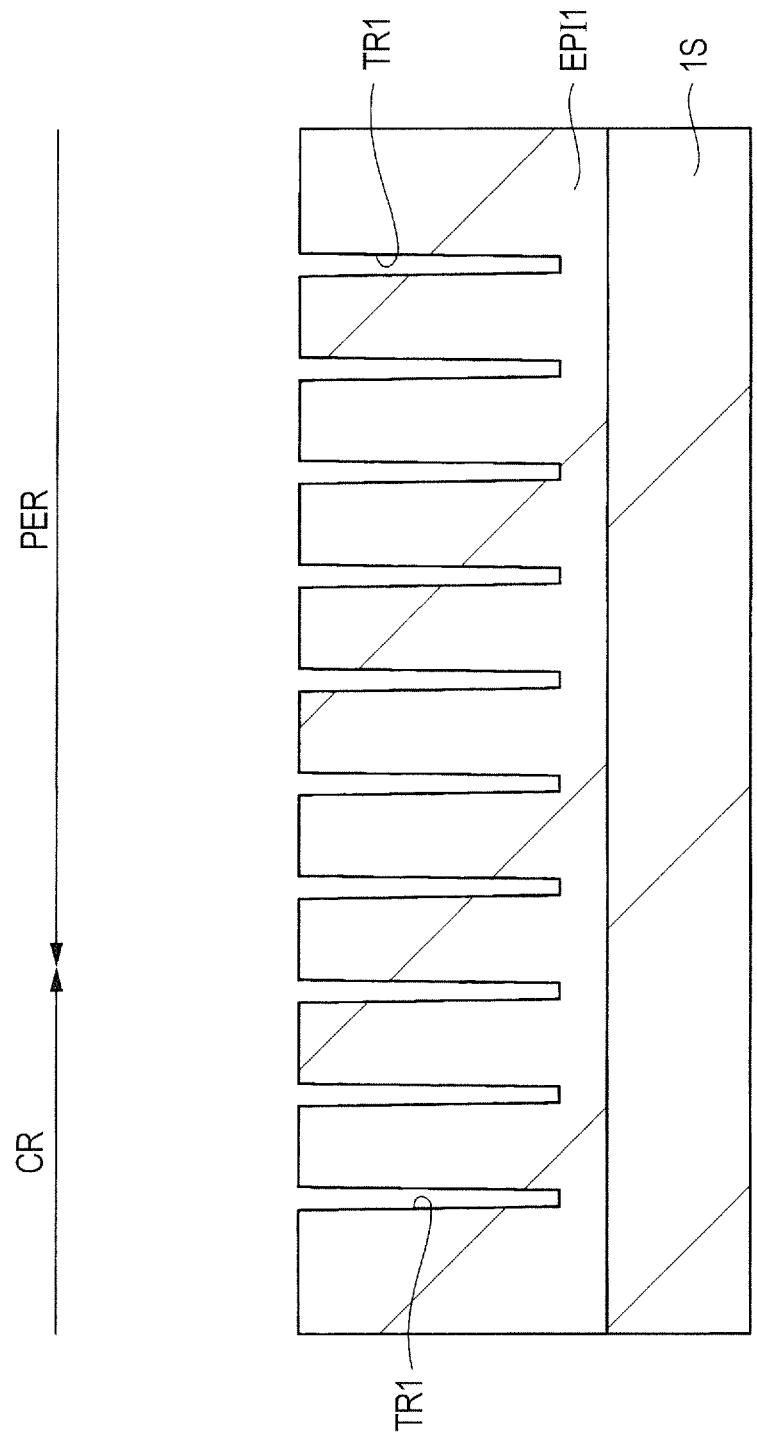
FIG. 6 is a sectional view illustrating the manufacturing process of the semiconductor device following FIG. 5.

Subsequently, as illustrated in FIG. 6, the resist film is removed, and then the trenches TR1 are formed in the epitaxial layer EPI1 with the patterned hard mask film as a mask. The hard mask film is then removed.

Figure 7:
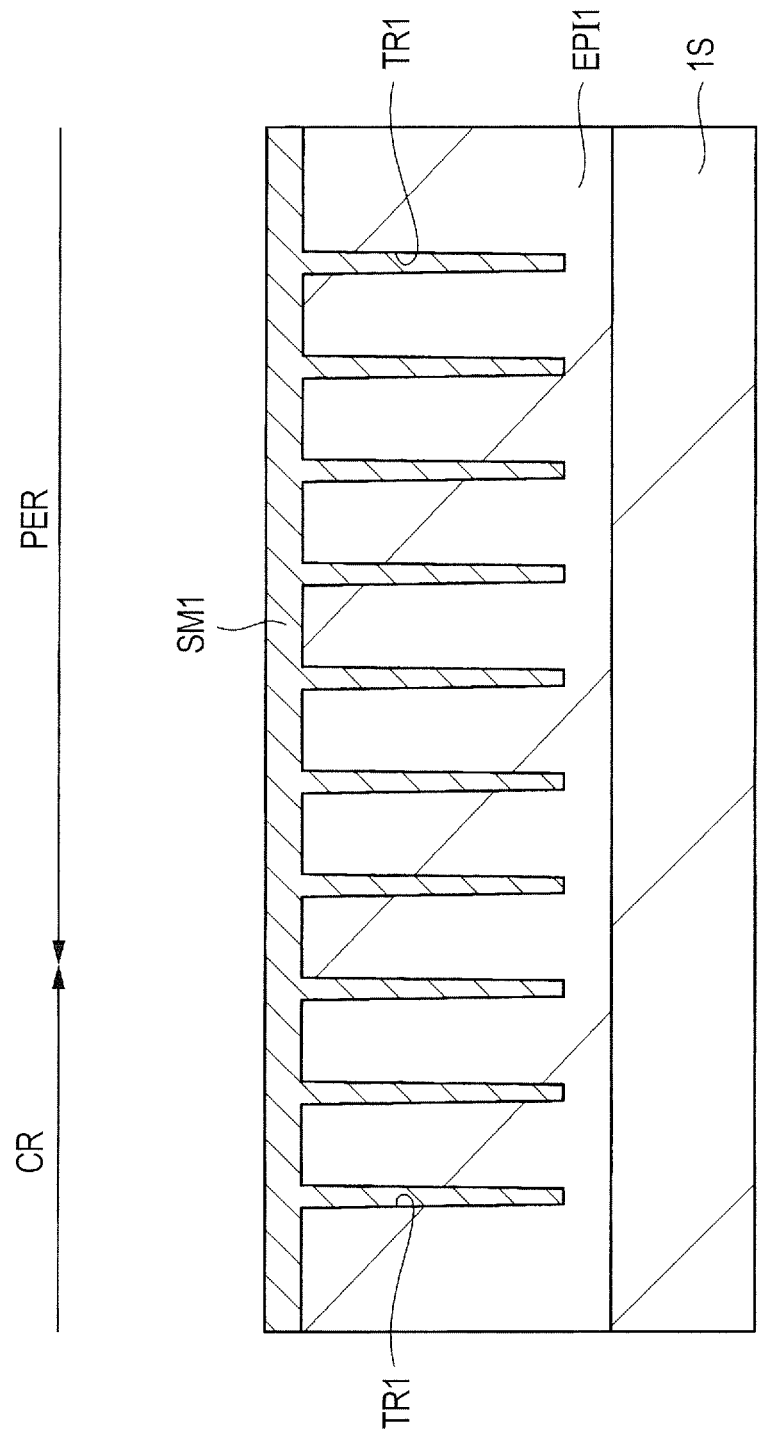
FIG. 7 is a sectional view illustrating the manufacturing process of the semiconductor device following FIG. 6.
Figure 8:
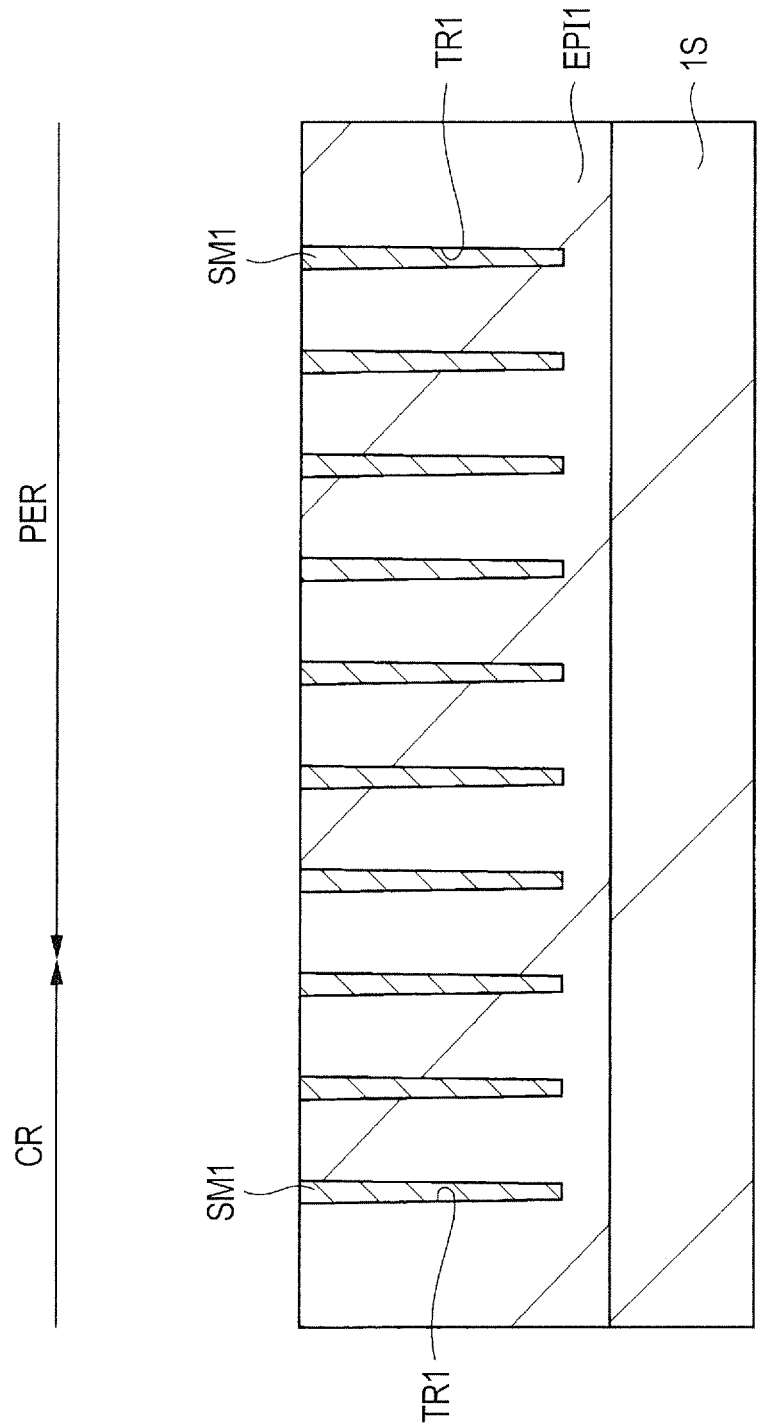
FIG. 8 is a sectional view illustrating the manufacturing process of the semiconductor device following FIG. 7.

Subsequently, as illustrated in FIG. 7, for example, a semiconductor material (silicon) SM1 doped with a p-type impurity is formed on the epitaxial layer EPI1 including the inside of the trench TR1. Specifically, the semiconductor material SM1 doped with the p-type impurity is formed using the epitaxial process. Consequently, the inside of the trench TR1 is filled with the semiconductor material SM1 doped with the p-type impurity. Subsequently, as illustrated in FIG. 8, the unnecessary semiconductor material SM1 provided on the surface of the epitaxial layer EPI1 is removed using a chemical mechanical polishing (CMP) process, for example.

Figure 9:
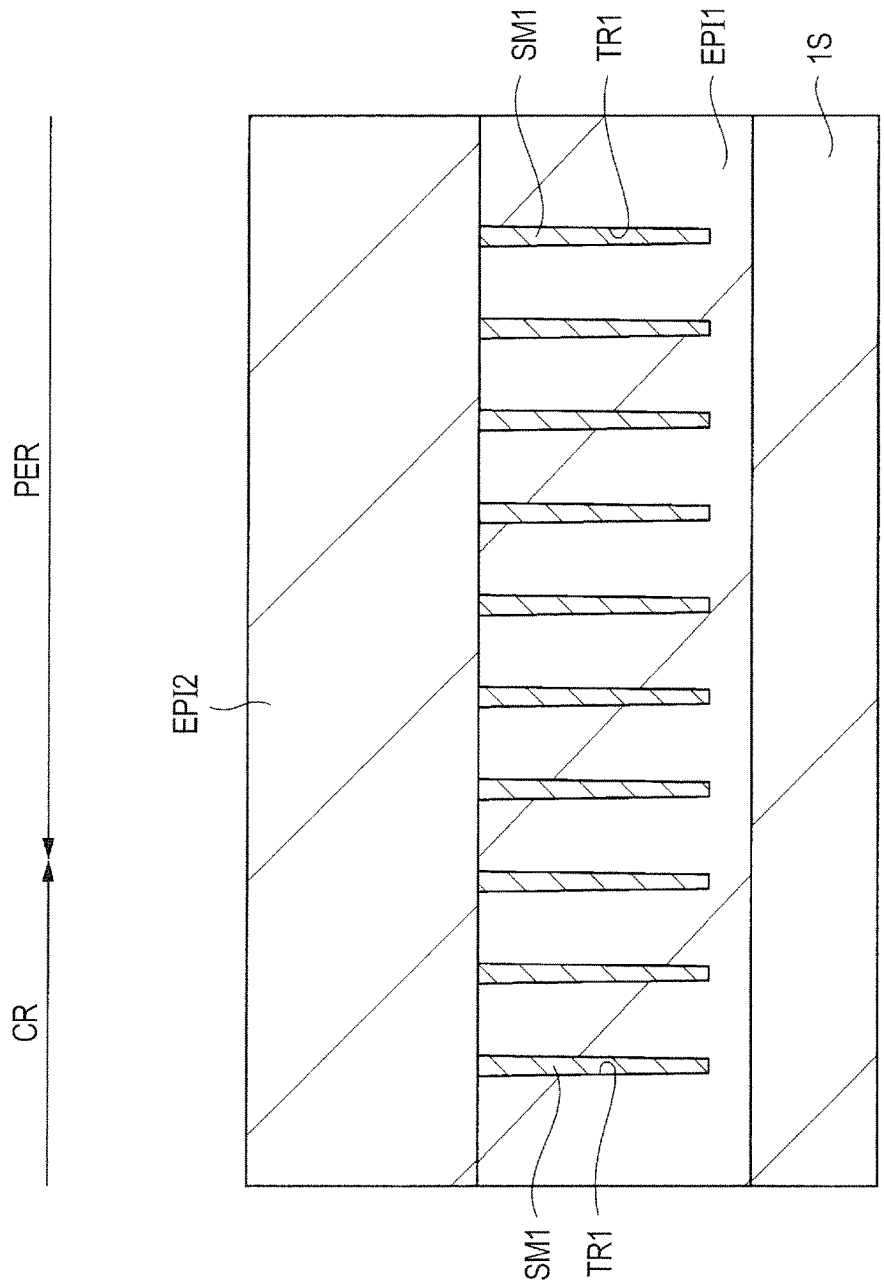
FIG. 9 is a sectional view illustrating the manufacturing process of the semiconductor device following FIG. 8.

Subsequently, as illustrated in FIG. 9, the epitaxial layer EPI2 doped with the n-type impurity is formed on the epitaxial layer EPI1 including the surface of each trench TR1 filled with the semiconductor material SM1 by an epitaxial growth process, for example. Subsequently, a hard mask film including, for example, a silicon oxide film is formed on the epitaxial layer EP2, and a resist film is formed on the hard mask film. Subsequently, the resist film is patterned using a photolithography technique. Subsequently, the hard mask film is patterned by etching with the patterned resist film as a mask.

Figure 10:
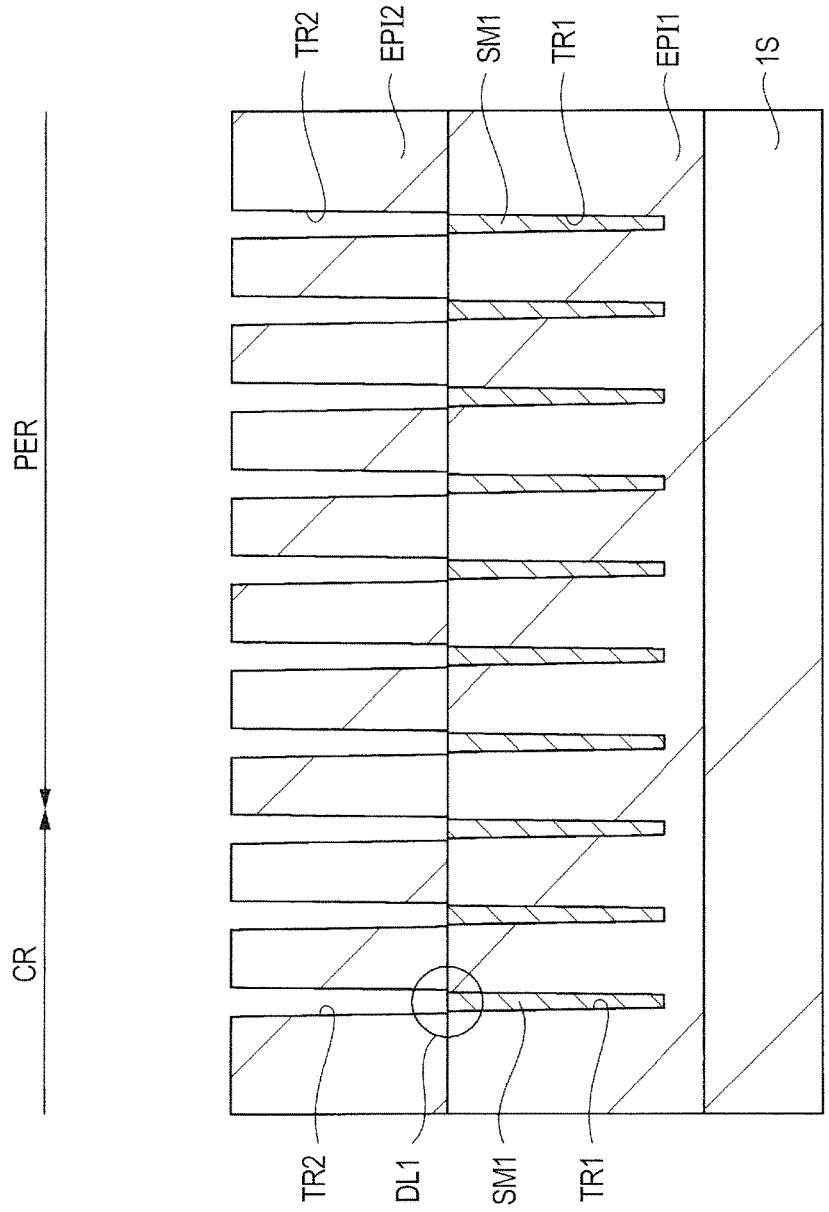
FIG. 10 is a sectional view illustrating the manufacturing process of the semiconductor device following FIG. 9.

Subsequently, as illustrated in FIG. 10, the resist film is removed, and then the trenches TR2 are formed in the epitaxial layer EPI2 by etching with the patterned hard mask film as a mask. The hard mask film is then removed. The trenches TR2 are thus formed in the epitaxial layer EPI2 while being planarly superposed on the trenches TR1 and connected therewith. In consideration of patterning accuracy, the bottom width of each trench TR2 is made larger than the top width of each trench TR1. As a result, as illustrated in FIG. 10, a level difference DL1 is formed in a boundary region between the trench TR1 and the trench TR2.

Figure 11:
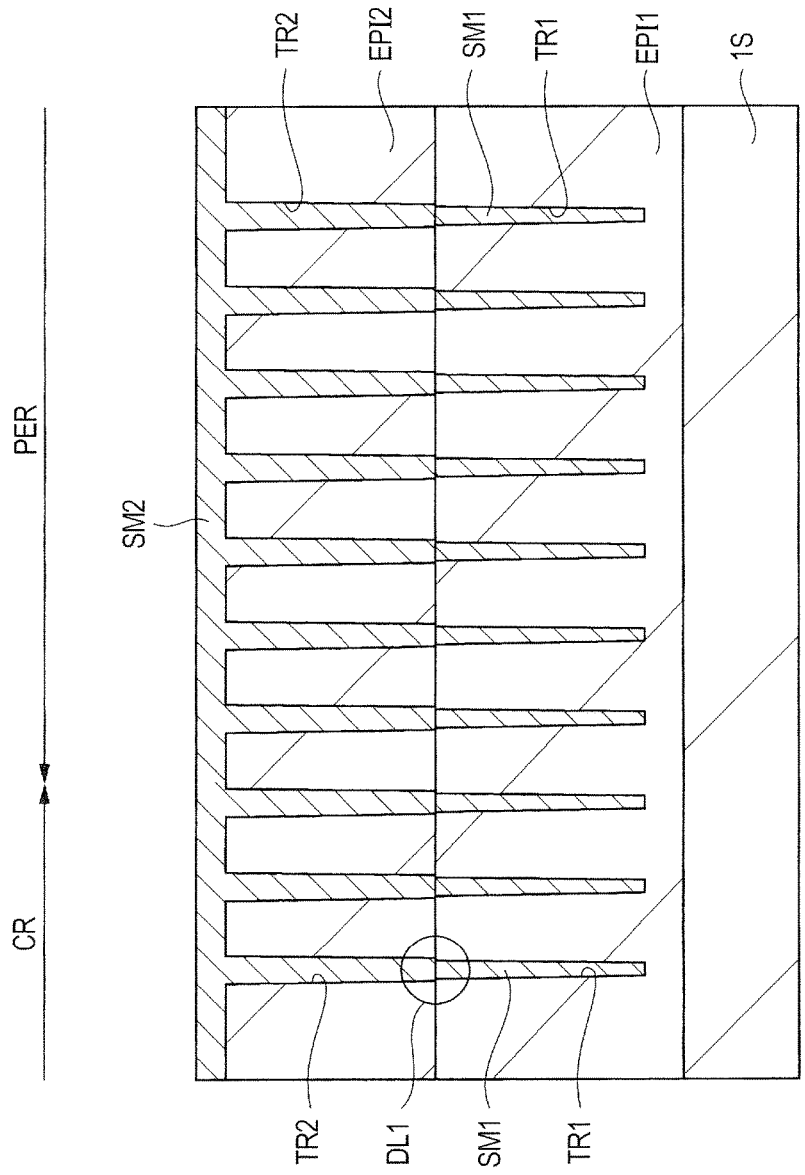
FIG. 11 is a sectional view illustrating the manufacturing process of the semiconductor device following FIG. 10.
Figure 12:
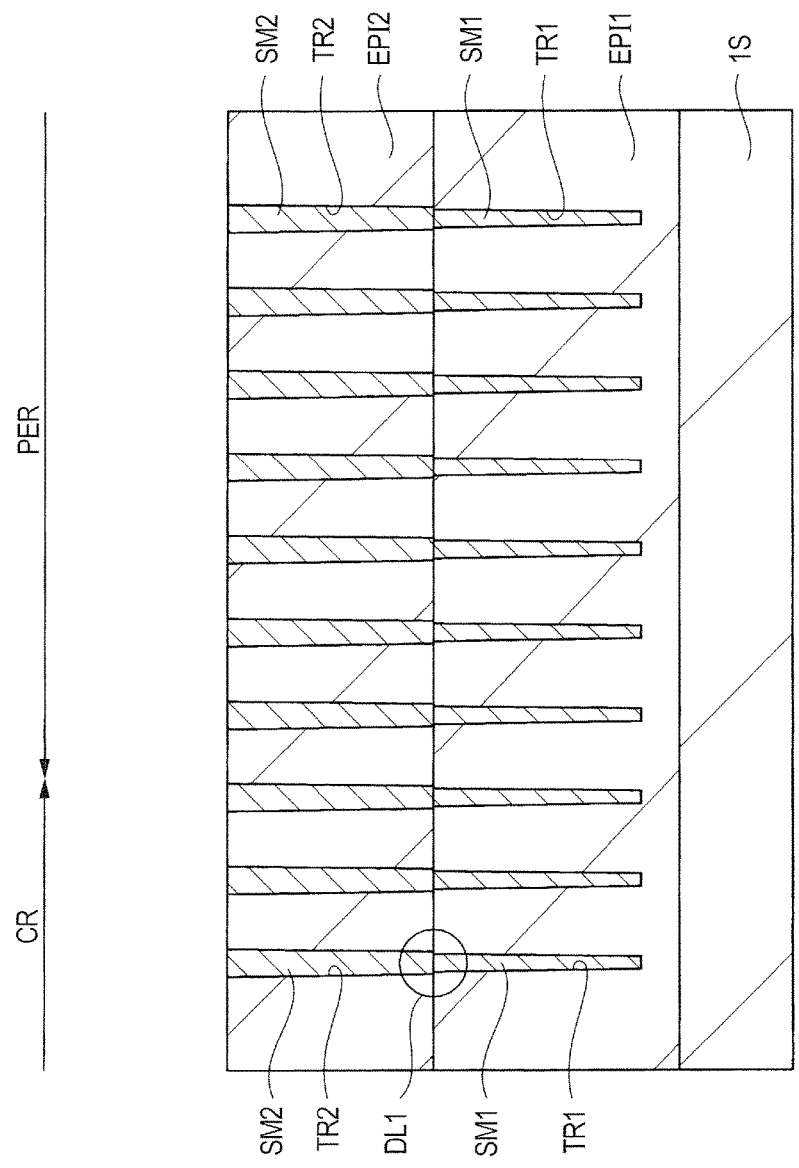
FIG. 12 is a sectional view illustrating the manufacturing process of the semiconductor device following FIG. 11.

Subsequently, as illustrated in FIG. 11, for example, a semiconductor material SM2 doped with a p-type impurity is formed on the epitaxial layer EPI2 including the inside of the trench TR2. Specifically, the semiconductor material SM2 doped with the p-type impurity is formed using the epitaxial process. Consequently, the inside of the trench TR2 is filled with the semiconductor material SM2 doped with the p-type impurity. Subsequently, as illustrated in FIG. 12, the unnecessary semiconductor material SM2 provided on the surface of the epitaxial layer EPI2 is removed using the CMP process, for example.

Figure 13:
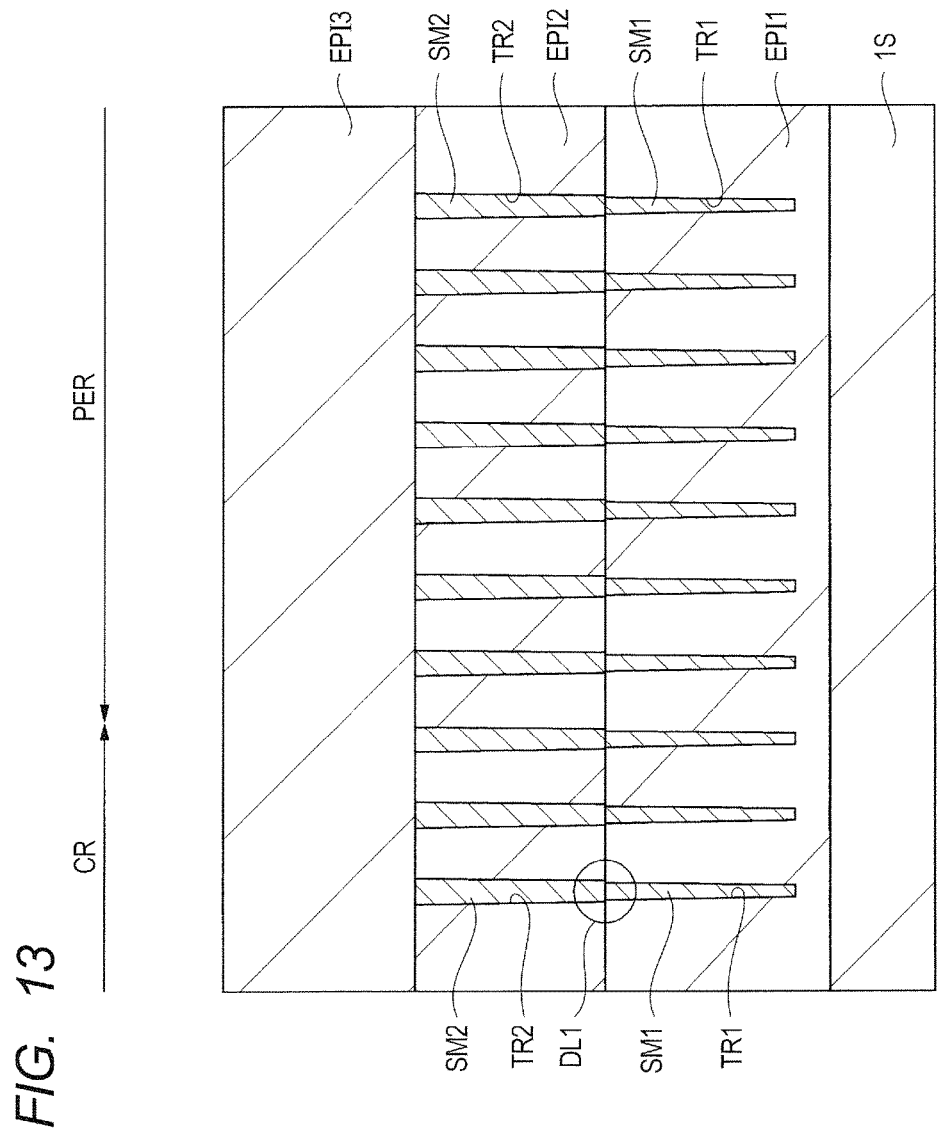
FIG. 13 is a sectional view illustrating the manufacturing process of the semiconductor device following FIG. 12.

Subsequently, as illustrated in FIG. 13, the epitaxial layer EPI3 doped with the n-type impurity is formed on the epitaxial layer EPI2 including the surface of each trench TR2 filled with the semiconductor material SM2 by the epitaxial growth process, for example. Subsequently, a hard mask film including, for example, a silicon oxide film is formed on the epitaxial layer EPI3, and a resist film is formed on the hard mask film. Subsequently, the resist film is patterned using the photolithography technique. Subsequently, the hard mask film is patterned by etching with the patterned resist film as a mask.

Figure 14:
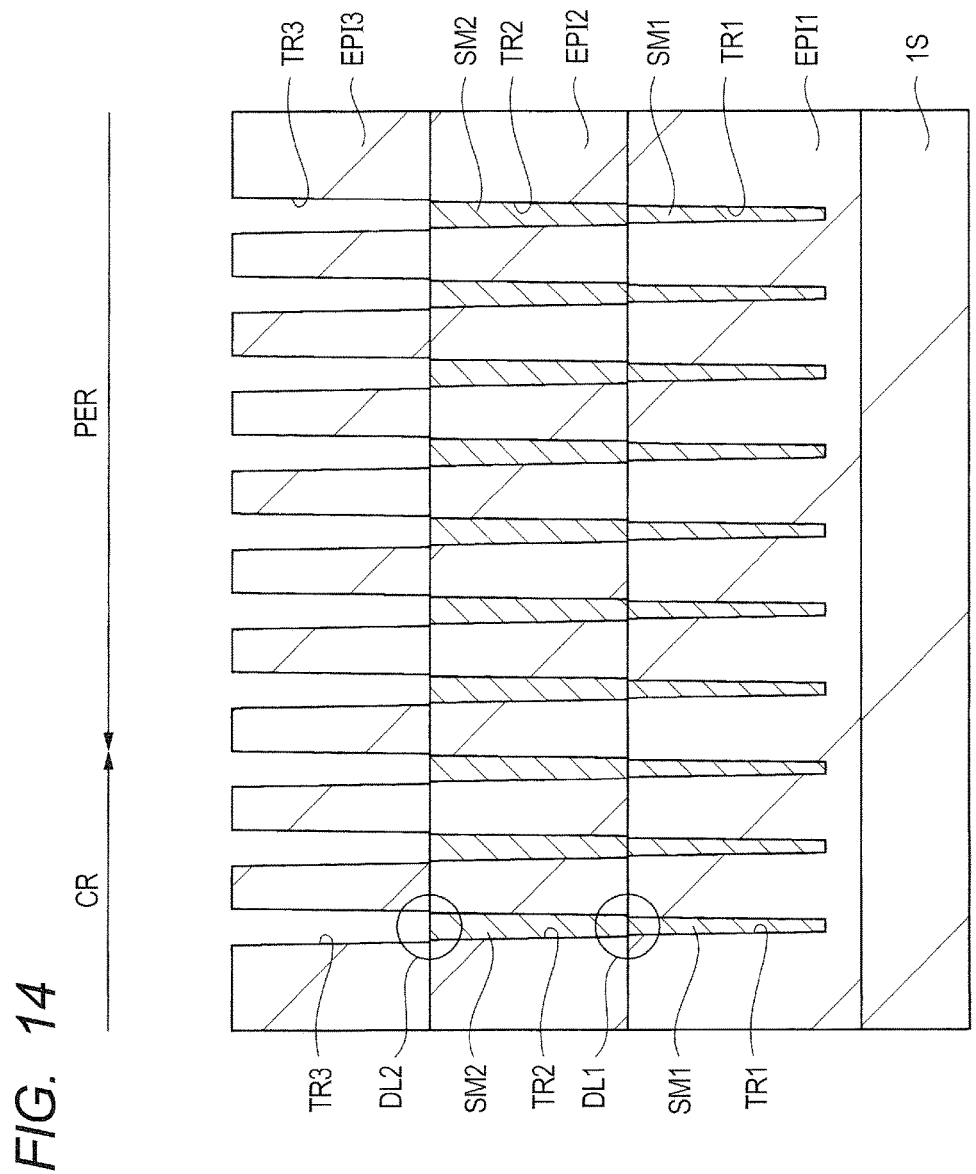
FIG. 14 is a sectional view illustrating the manufacturing process of the semiconductor device following FIG. 13.

Subsequently, as illustrated in FIG. 14, the resist film is removed, and then the trenches TR3 are formed in the epitaxial layer EPI3 by etching with the patterned hard mask film as a mask. The hard mask film is then removed. The trenches TR3 are thus formed in the epitaxial layer EPI3 while being planarly superposed on the trenches TR2 and connected therewith. In consideration of patterning accuracy, the bottom width of the trench TR3 is made larger than the top width of the trench TR2. As a result, as illustrated in FIG. 14, a level difference DL2 is formed in a boundary region between the trench TR2 and the trench TR3.

Figure 15:
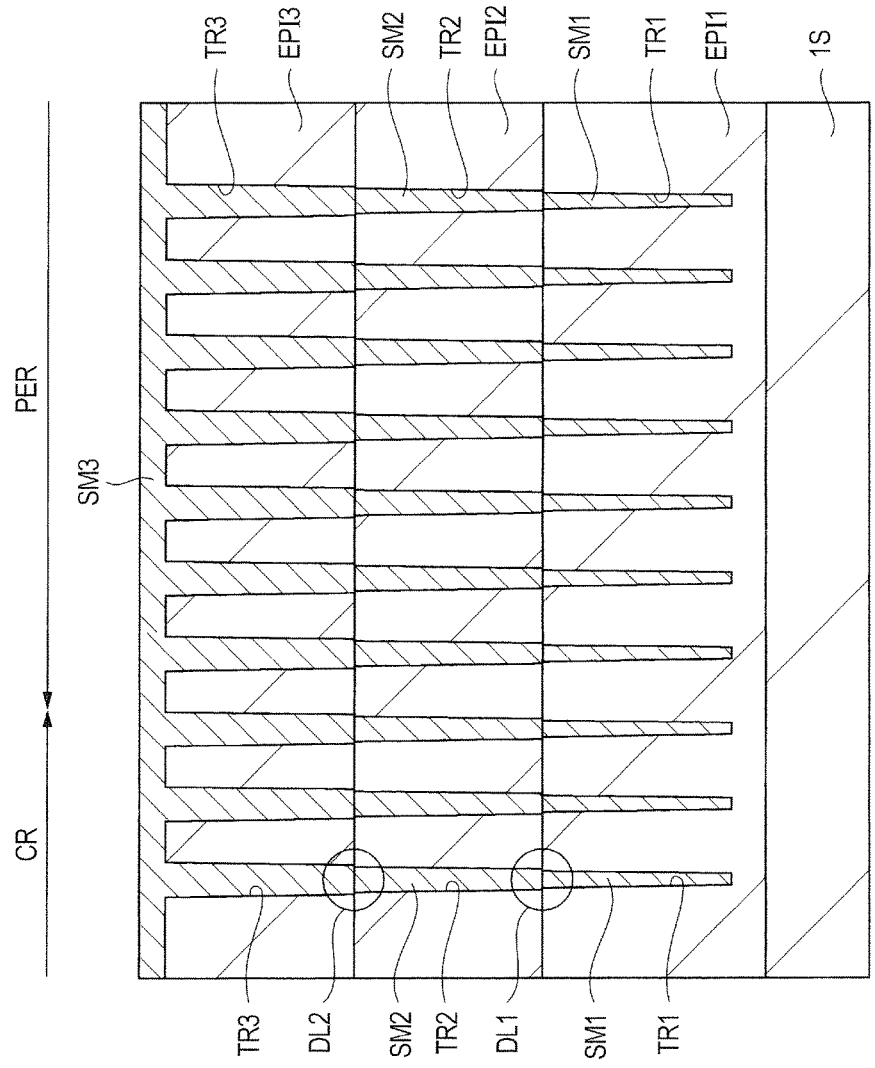
FIG. 15 is a sectional view illustrating the manufacturing process of the semiconductor device following FIG. 14.
Figure 16:
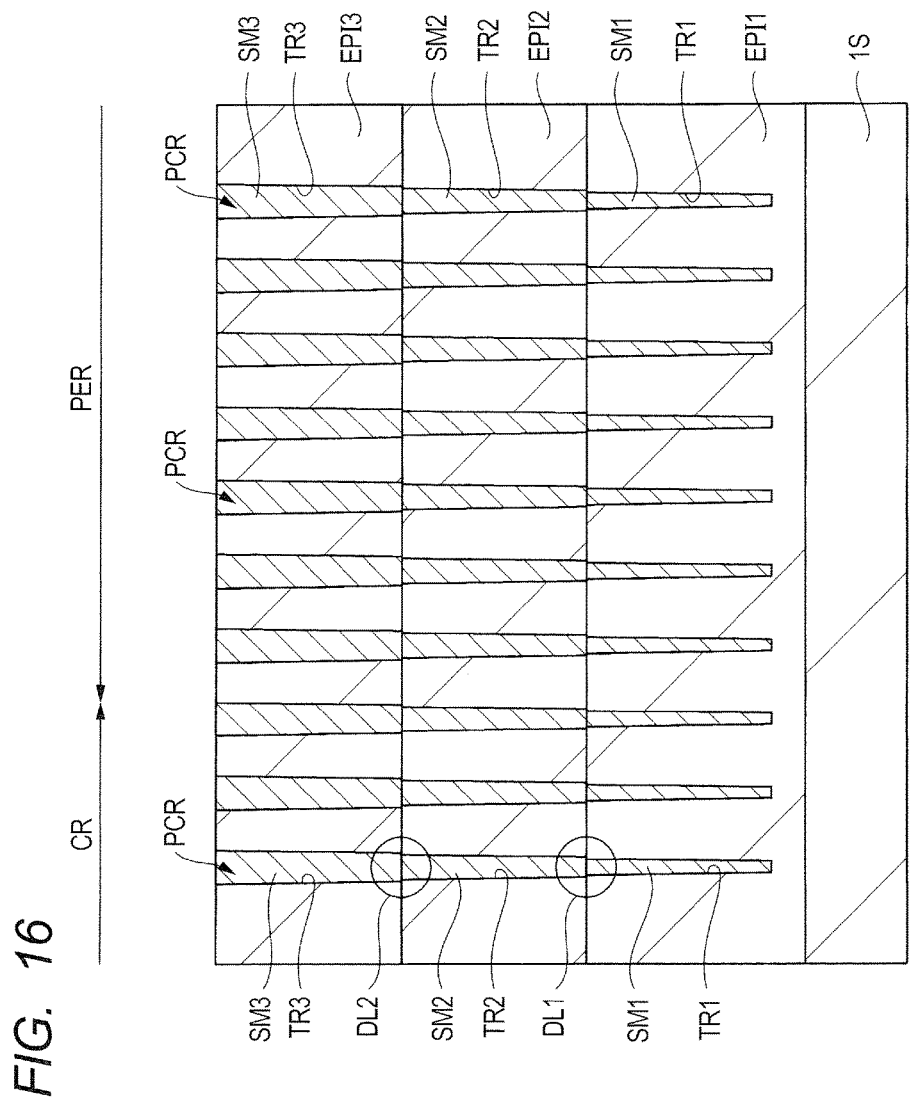
FIG. 16 is a sectional view illustrating the manufacturing process of the semiconductor device following FIG. 15.

Subsequently, as illustrated in FIG. 15, for example, a semiconductor material SM3 doped with a p-type impurity is formed on the epitaxial layer EPI3 including the inside of the trench TR3. Specifically, the semiconductor material SM3 doped with the p-type impurity is formed using the epitaxial process. Consequently, the inside of the trench TR3 is filled with the semiconductor material SM3 doped with the p-type impurity. Subsequently, as illustrated in FIG. 16, the unnecessary semiconductor material SM3 provided on the surface of the epitaxial layer EPI3 is removed using the CMP process, for example. In this way, the super junction structure of the first embodiment is formed. Specifically, as illustrated in FIG. 16, the p-type column regions PCR can be formed through the stacked epitaxial layers EPI1 to EPI3. Each p-type column region PCR is configured of a combination of the trench TR1 filled with the semiconductor material SM1, the trench TR2 filled with the semiconductor material SM2, and the trench TR3 filled with the semiconductor material SM3.

A manufacturing process of the element section provided on the super junction structure of the first embodiment is now described.

Figure 17:
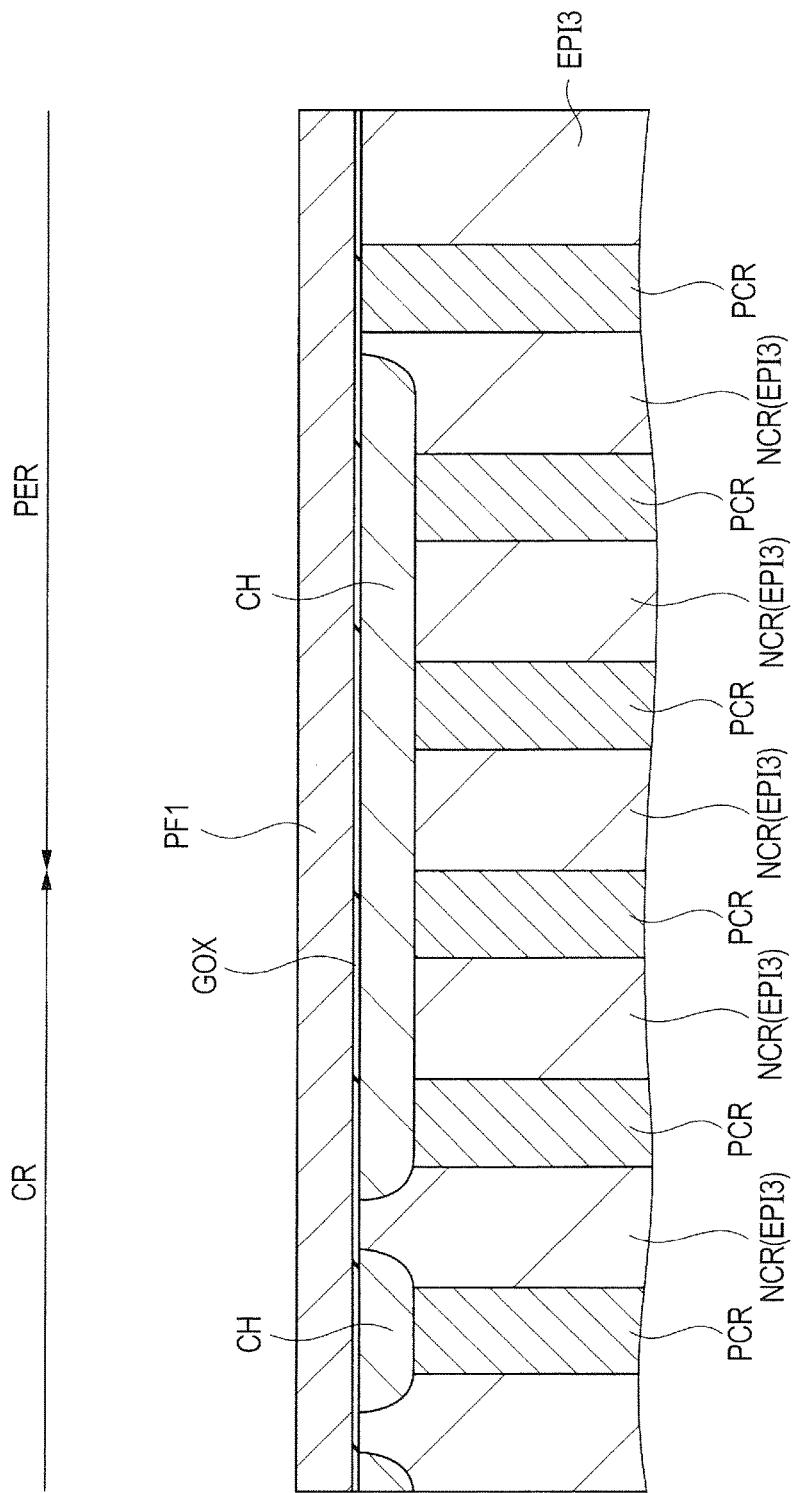
FIG. 17 is a sectional view illustrating the manufacturing process of the semiconductor device following FIG. 16.

As illustrated in FIG. 17, the channel region CH is formed across the cell region CR and the peripheral region PER using a photolithography technique and an ion implantation process. The channel region CH is a p-type semiconductor region formed by introducing a p-type impurity such as boron (B) into the epitaxial layer EPI3.

Subsequently, the gate insulating film GOX is formed on the surface of the epitaxial layer EPI3, and a conductor film PF1 is formed on the gate insulating film GOX. The gate insulating film GOX is formed of, for example, a silicon oxide film, and can be formed by a thermal oxidation process, for example. However, the gate insulating film GOX can be formed not only of the silicon oxide film, but also of a high-dielectric film having a dielectric constant higher than that of the silicon oxide film, the high-dielectric film being typified by a hafnium oxide film, for example. The conductor film PF1 provided on the gate insulating film GOX is formed of, for example, a polysilicon film, and can be formed using a chemical vapor deposition (CVD) process, for example.

Figure 18:
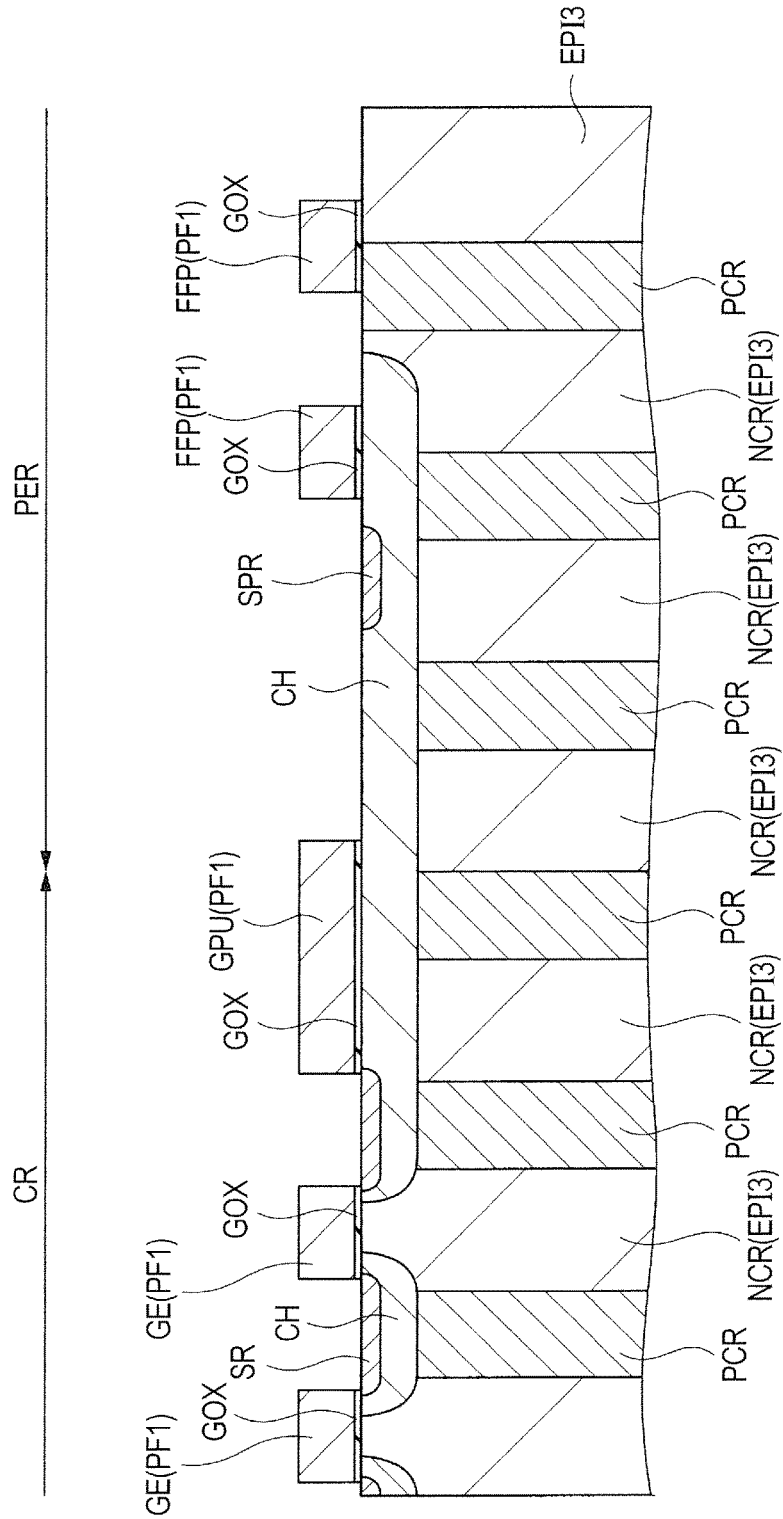
FIG. 18 is a sectional view illustrating the manufacturing process of the semiconductor device following FIG. 17.

Subsequently, as illustrated in FIG. 18, the conductor film PF1 is patterned using the photolithography technique and the etching technique. Consequently, the gate electrodes GE and the gate lead sections GPU are formed in the cell region CR, and a plurality of electrodes (dummy electrodes) FFP are formed in the peripheral region PER. In the cell region CR, the gate lead section GPU is formed so as to be electrically coupled to the gate electrodes GE.

Figure 19:
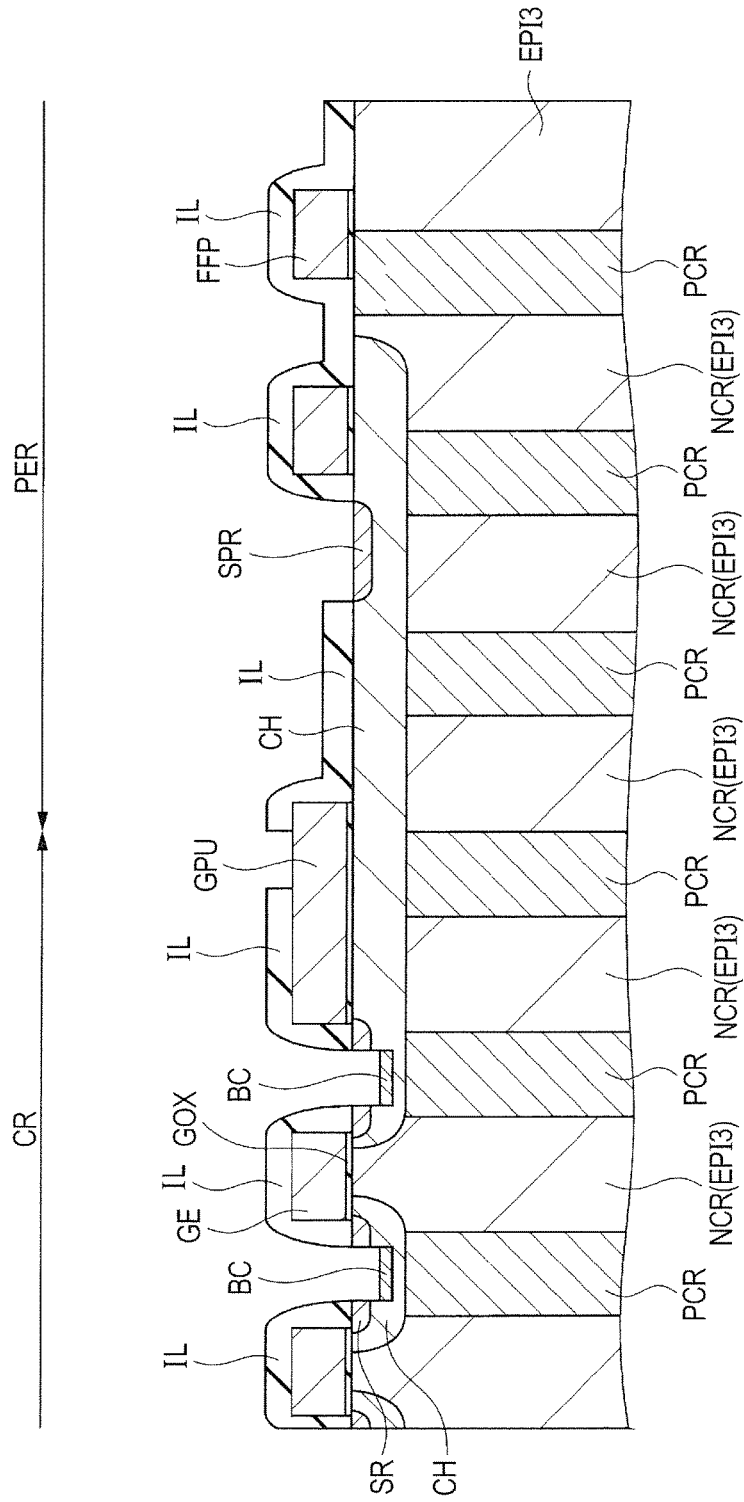
FIG. 19 is a sectional view illustrating the manufacturing process of the semiconductor device following FIG. 18.

Subsequently, as illustrated in FIG. 19, the photolithography technique and the ion implantation process are used to form the source regions SR matching with the gate electrodes GE in the cell region CR, and form the source lead region SPR in the peripheral region PER. The source region SR and the source lead region SPR are each an n-type semiconductor region formed by introducing an n-type impurity such as phosphor or arsenic into the epitaxial layer EPI3. The source regions SR in the cell region CR are electrically coupled to the source lead region SPR provided in the peripheral region PER.

Subsequently, the interlayer insulating film IL is formed on the epitaxial layer EPI3 so as to cover the gate electrodes GE, the gate lead section GPU, and the electrodes FFP. The interlayer insulating film IL is formed of, for example, a silicon oxide film, and can be formed using the CVD process, for example. In the cell region CR, the photolithography technique and the etching technique are used to form a trench, which runs through the interlayer insulating film IL and the source region SR and reaches at its bottom the channel region CH, between the gate electrodes GE adjacent to each other, and form an opening that exposes part of the gate lead section GPU. In the peripheral region PER, an opening is formed in the interlayer insulating film IL to expose the source lead region SPR. Subsequently, in the cell region CR, the photolithography technique and the ion implantation process are used to form the body contact regions BC on the bottoms of the trenches each of which runs through the interlayer insulating film IL and the source region SR and reaches at its bottom the channel region CH. The body contact region BC, which is a p-type semiconductor region formed by introducing a p-type impurity such as boron (B) into the epitaxial layer EPI3, is formed so as to have an impurity concentration higher than that of the channel region CH.

Figure 20:
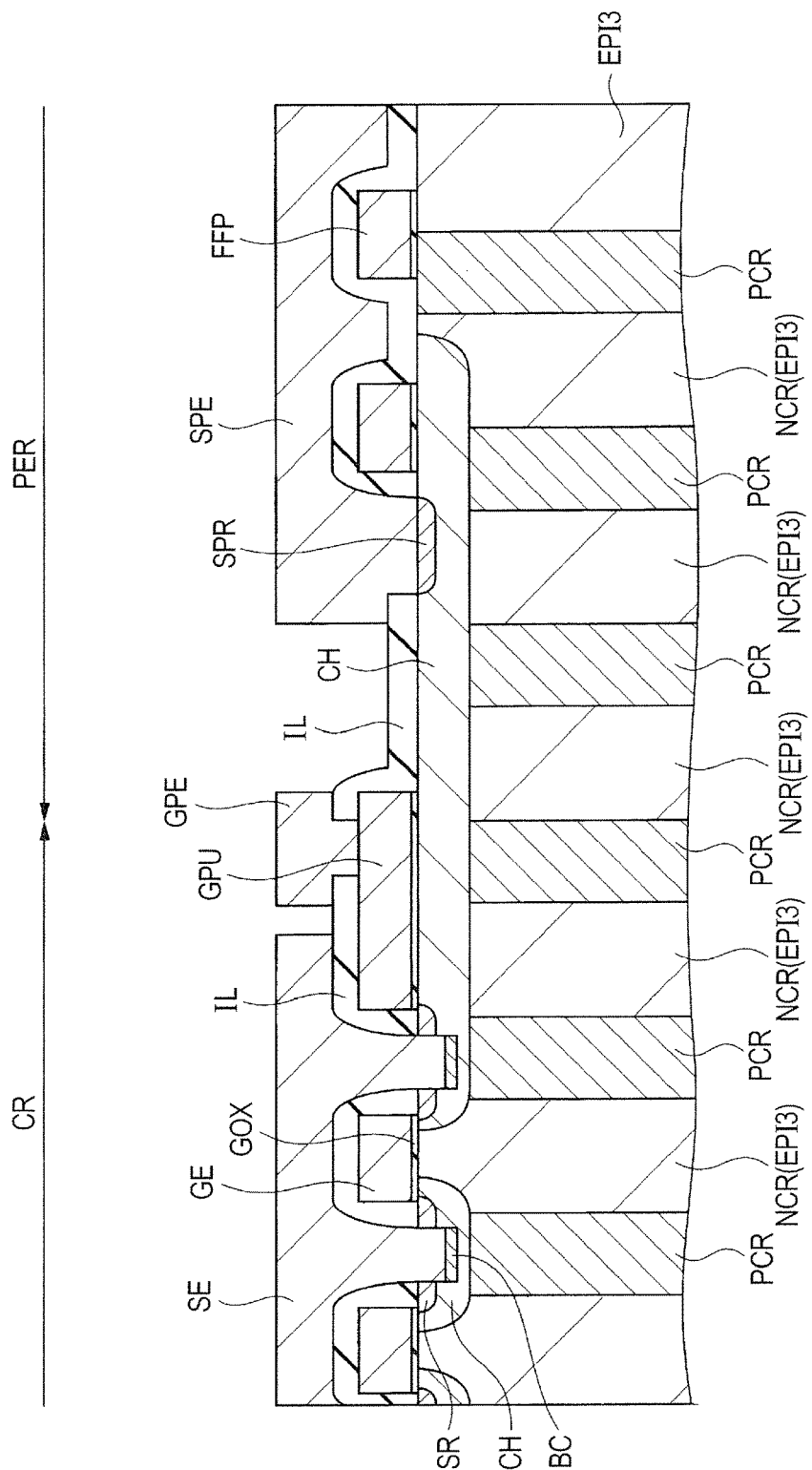
FIG. 20 is a sectional view illustrating the manufacturing process of the semiconductor device following FIG. 19.

Subsequently, as illustrated in FIG. 20, a metal film is formed on the interlayer insulating film IL including the trenches having the body contact regions BC on their bottoms, the opening exposing the gate lead section GPU, and the opening exposing the source lead region SPR. The metal film is formed of, for example, a stacked film of a titanium-tungsten film and an aluminum alloy film, and can be formed using a sputtering process, for example. The metal film is patterned using the photolithography technique and the etching technique. Consequently, in the cell region CR, there are formed the source electrode SE electrically coupled to the source regions SR and the body contact regions BC, and formed the gate lead electrode GPE electrically coupled to the gate lead section GPU. In the peripheral region PER, there is formed the source lead electrode SPE electrically coupled to the source lead region SPR.

Subsequently, as illustrated in FIG. 4, the surface protective film PAS is formed so as to cover the source electrode SE, the gate lead electrode GPE, and the source lead electrode SPE. The surface protective film PAS is patterned using the photolithography technique and the etching technique to expose part of the source electrode SE, part of the gate lead electrode GPE, and part of the source lead electrode SPE. Consequently, the regions exposed from the surface protective film are each allowed to serve as an external coupling region. In this way, the semiconductor device of the first embodiment can be manufactured.

Characteristic Features of First Embodiment

Characteristic points of the first embodiment are now described. The first characteristic point of the first embodiment is that the epitaxial layer EPI is dividedly formed in layers using the trench fill process, and when each of the layers has been formed, the trenches are formed in that layer. Such a method peculiar to the first embodiment is referred to as "multi-trench fill process". Specifically, in the multi-trench fill process of the first embodiment, as illustrated in FIGS. 5 to 16, when the epitaxial layer EPI1 has been formed, the trenches TR1 are formed in the epitaxial layer EPI1. Subsequently, when the epitaxial layer EPI2 has been formed, the trenches TR2 are formed in the epitaxial layer EPI2. Subsequently, when the epitaxial layer EPI3 has been formed, the trenches TR3 are formed in the epitaxial layer EPI3.

In particular, the trenches TR2 are formed on the trenches TR1 so as to be in communication with the trenches TR1. Likewise, the trenches TR3 are formed on the trenches TR2 so as to be in communication with the trenches TR2.

For example, although the aspect ratio of each of the trenches TR1 to TR3 is set to an aspect ratio allowed for formation of the trench in a single epitaxial layer, the aspect ratio of the entire trench (TR1+TR2+TR3) as a combination of the trenches TR1 to TR3 can be made higher than the aspect ratio allowed for formation of the trench in a single epitaxial layer. In other words, the aspect ratio of the entire trench (TR1+TR2+TR3) as a combination of the trenches TR1 to TR3 can exceed the allowable aspect ratio for the trench formed in a single epitaxial layer. That is, the multi-trench fill process of the first embodiment advantageously allows formation of a trench having an aspect ratio beyond the manufacturing limit. Thus, the multi-trench fill process of the first embodiment allows a larger depth of the trench compared with a trench by the trench fill process, leading to a further increase in withstand voltage of the super junction structure.

The second characteristic point of the first embodiment is that the bottom width of the trench TR2 formed in the epitaxial layer EPI2 is larger than the top width of the trench TR1 formed in the epitaxial layer EPI1, for example, as illustrated in FIG. 10. In other words, the second characteristic point of the first embodiment is that the top of the trench TR1 formed in the epitaxial layer EPI1 is enveloped by the bottom of the trench TR2 formed in the epitaxial layer EPI2.

Likewise, the second characteristic point of the first embodiment is that the bottom width of the trench TR3 formed in the epitaxial layer EPI3 is larger than the top width of the trench TR2 formed in the epitaxial layer EPI2, for example, as illustrated in FIG. 14. In other words, the second characteristic point of the first embodiment is that the top of the trench TR2 formed in the epitaxial layer EPI2 is enveloped by the bottom of the trench TR3 formed in the epitaxial layer EPI3.

Consequently, according to the first embodiment, it is possible to suppress misalignment of the trench TR1 and the trench TR2 and misalignment of the trench TR2 and the trench TR3. Specifically, in the first embodiment, since the trenches TR1, TR2, and TR3 are formed by different photolithography steps, misalignment in patterning is concerned. In this regard, the first embodiment has the second characteristic point that the bottom width of the trench TR2 is larger than the top width of the trench TR1, and that the bottom width of the trench TR3 is larger than the top width of the trench TR2, leading to a sufficient margin for misalignment between the trench TR1 and the trench TR2. As a result, according to the first embodiment, coupling reliability between the trench TR1, the trench TR2, and the trench TR3 can be improved. Due to such a second characteristic point of the first embodiment, the aspect ratio of the trench TR1 formed in the lower layer is larger than that of the trench TR2 formed in the upper layer. In other words, the aspect ratio of the trench TR2 formed in the upper layer is smaller than the aspect ratio of the trench TR1 formed in the lower layer. This is because while the depth of the trench TR1 is equal to that of the trench TR2, the bottom width of the trench TR2 formed in the upper layer is larger than the bottom width of the trench TR1 formed in the lower layer owing to the second characteristic point.

Likewise, the aspect ratio of the trench TR2 formed in the lower layer is larger than that of the trench TR3 formed in the upper layer. In other words, the aspect ratio of the trench TR3 formed in the upper layer is smaller than the aspect ratio of the trench TR2 formed in the lower layer. This is because while the depth of the trench TR2 is equal to that of the trench TR3, the bottom width of the trench TR3 formed in the upper layer is larger than the bottom width of the trench TR2 formed in the lower layer owing to the second characteristic point.

Due to such a second characteristic point of the first embodiment, for example, as illustrated in FIG. 3, the super junction structure of the first embodiment has the level difference DL1 at a boundary position (first position) between the trench TR1 and the trench TR2, and the level difference DL2 at a boundary position (a second position shallower than the first position) between the trench TR2 and the trench TR3. Specifically, as illustrated in FIG. 3, each of the p-type column regions PCR in the super junction structure of the first embodiment is formed of the trench (TR1+ TR2+TR3) formed in the epitaxial layers EPI1 to EPI3 and the p-type semiconductor material filling the trench (TR1+ TR2+TR3). The level differences DL1 and DL2 are provided on the inner wall of the trench (TR1+TR2+TR3).

The width of the trench TR2 at a position shallower than the depth position of the level difference DL1 is larger than the width of the trench TR2 at the depth position of the level difference DL1, and the width of the trench TR1 at a position deeper than the depth position of the level difference DL1 is smaller than the width of the trench TR1 at the depth position of the level difference DL1. Likewise, the width of the trench TR3 at a position shallower than the depth position of the level difference DL2 is larger than the width of the trench TR3 at the depth position of the level difference DL2, and the width of the trench TR2 at a position deeper than the depth position of the level difference DL2 is smaller than the width of the trench TR2 at the depth position of the level difference DL2.

The p-type column region PCR in the first embodiment configured in this way is advantageous in that an uneven high electric field is less likely to be generated in the depth direction of the p-type column region PCR, and that a high-field point is readily formed in a region below the p-type column region PCR away from the element section.

Modification

Figure 21:
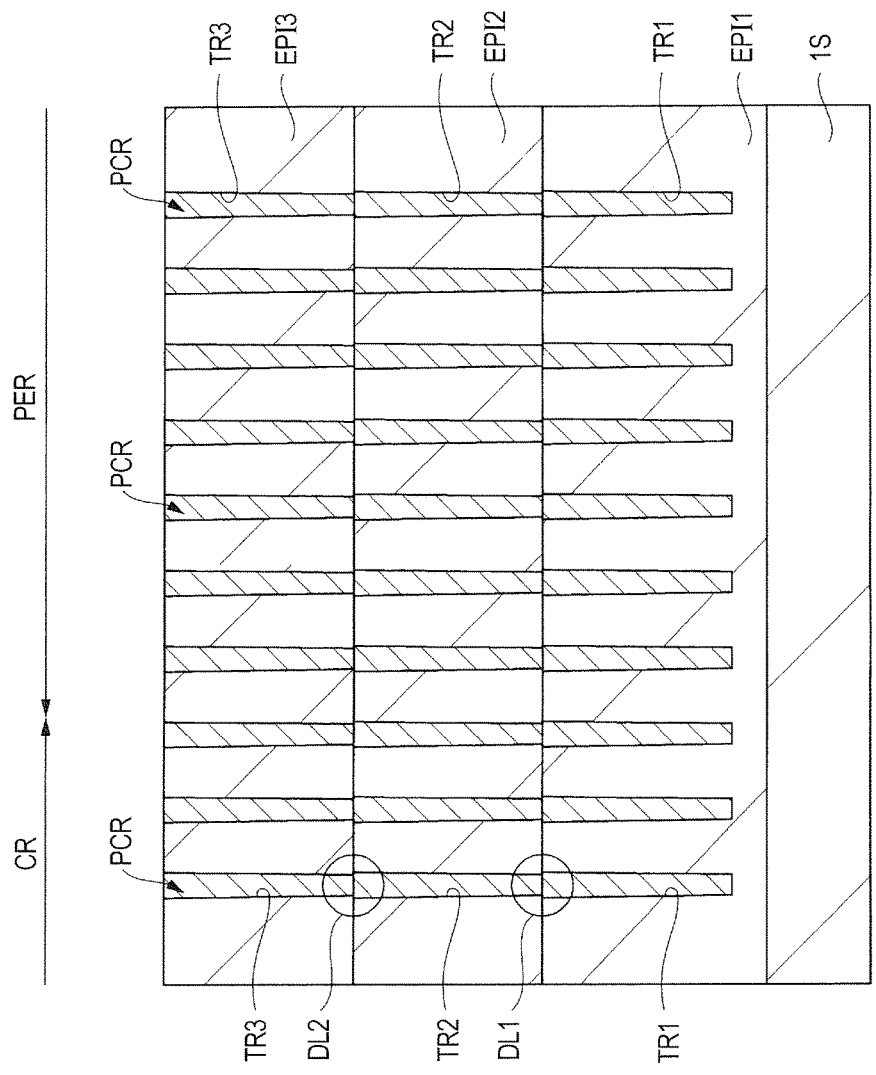
FIG. 21 is a sectional view illustrating a super junction structure of a modification.

FIG. 21 is a sectional view illustrating a super junction structure of a first modification. In the first modification, the shape of the trench TR1 provided in the epitaxial layer EPI1, the shape of the trench TR2 provided in the epitaxial layer EPI2, and the shape of the trench TR3 provided in the epitaxial layer EPI3 are equal to one another. Furthermore, the aspect ratio of the trench TR1, the aspect ratio of the trench TR2, and the aspect ratio of the trench TR3 are equal to one another.

In this modification, for example, as illustrated in FIG. 21, the bottom width of the trench TR2 is smaller than the top width of the trench TR1, and the bottom width of the trench TR3 is smaller than the top width of the trench TR2. Consequently, as illustrated in FIG. 21, the super junction structure of the first modification also has the level difference DL1 at a boundary position (first position) between the trench TR1 and the trench TR2, and the level difference DL2 at a boundary position (a second position shallower than the first position) between the trench TR2 and the trench TR3.

In the first modification, the shape of the trench TR1, the shape of the trench TR2, and the shape of the trench TR3 are equal to one another. Hence, the modification is advantageous in that the dimensions or the processing conditions of each of the trenches TR1 to TR3 are each not necessary to be varied, and that the trenches TR1 to TR3 may be formed with the same pattern alignment accuracy.

Second Embodiment

Figure 22:
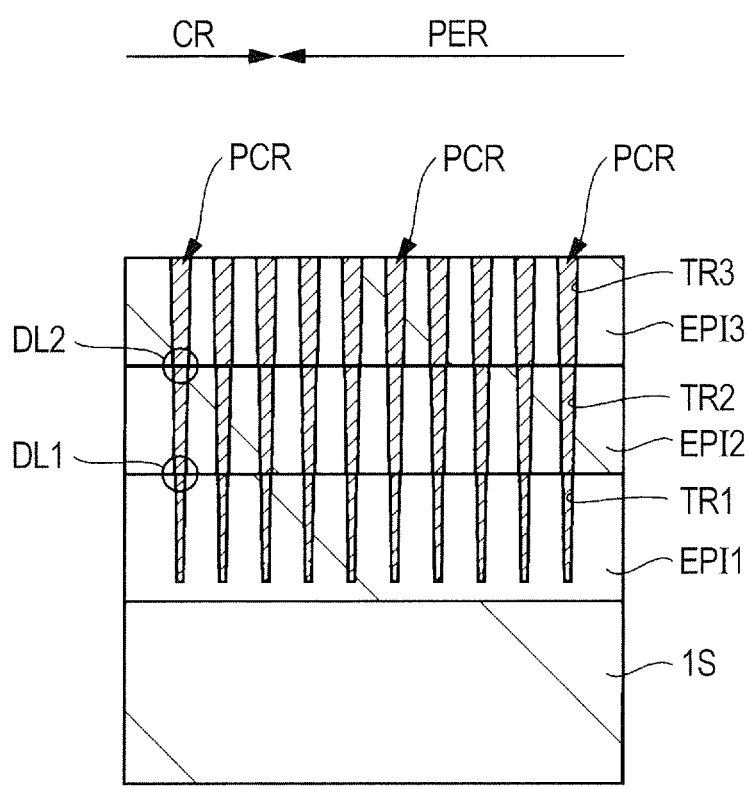
FIG. 22 is a sectional view illustrating a super junction structure of a second embodiment.

FIG. 22 is a sectional view illustrating a super junction structure of a second embodiment. In the super junction structure of the second embodiment illustrated in FIG. 22, while the trench TR1 maintains an aspect ratio similar to that of the typical super junction structure, the dimensions and the depth of each of the trenches TR1 to TR3 are each reduced to one-third of that of the typical super junction structure illustrated in FIG. 2. In this case, the width of the bottom of the trench TR1 is smaller than that of the trench TR of the typical super junction structure illustrated in FIG. 2. In the super junction structure of the second embodiment illustrated in FIG. 22, therefore, the p-type column regions PCR can be shrunk unlike the typical super junction structure illustrated in FIG. 2. As a result, the super junction structure of the second embodiment is allowed to reduce the on resistance.

In this regard, in the multi-epitaxial process, the p-type column regions PCR is formed by the ion implantation process. In consideration of the impurity diffusion effect, therefore, a space between the p-type column regions PCR adjacent to each other cannot be sufficiently reduced. In the multi-trench fill process of the second embodiment, the p-type column regions PCR are formed by a filling epitaxial process for the respective trenches (TR1 to TR3) formed in the epitaxial layers (EPI1 to EPI3). In the multi-trench fill process, therefore, formation accuracy of the p-type column regions PCR is determined by formation accuracy of the trenches TR1 to TR3. The trenches TR1 to TR3 are formed by the photolithography technique. Accuracy of the photolithography technique is higher than that of the ion implantation process. Hence, the p-type column regions PCR can be formed with a higher accuracy by the multi-trench fill process than by the multi-epitaxial process. This means that the space between the p-type column regions PCR adjacent to each other can be more reduced in the multi-trench fill process than in the multi-epitaxial process. Consequently, the multi-trench fill process advantageously allows manufacture of a power MOSFET having a small on resistance compared with on resistance given by the multi-epitaxial process. Specifically, the multi-trench fill process of the second embodiment enables shrink of the p-type column regions PCR by the synergy of the point that the trenches TR1 to TR3 are formed while being reduced in dimensions and depth, and the point that the trenches TR1 to TR3 can be formed using the accurate photolithography technique. As a result, the super junction structure formed by the multi-trench fill process of the second embodiment achieves a further reduction in on resistance.

Third Embodiment

Figure 23:
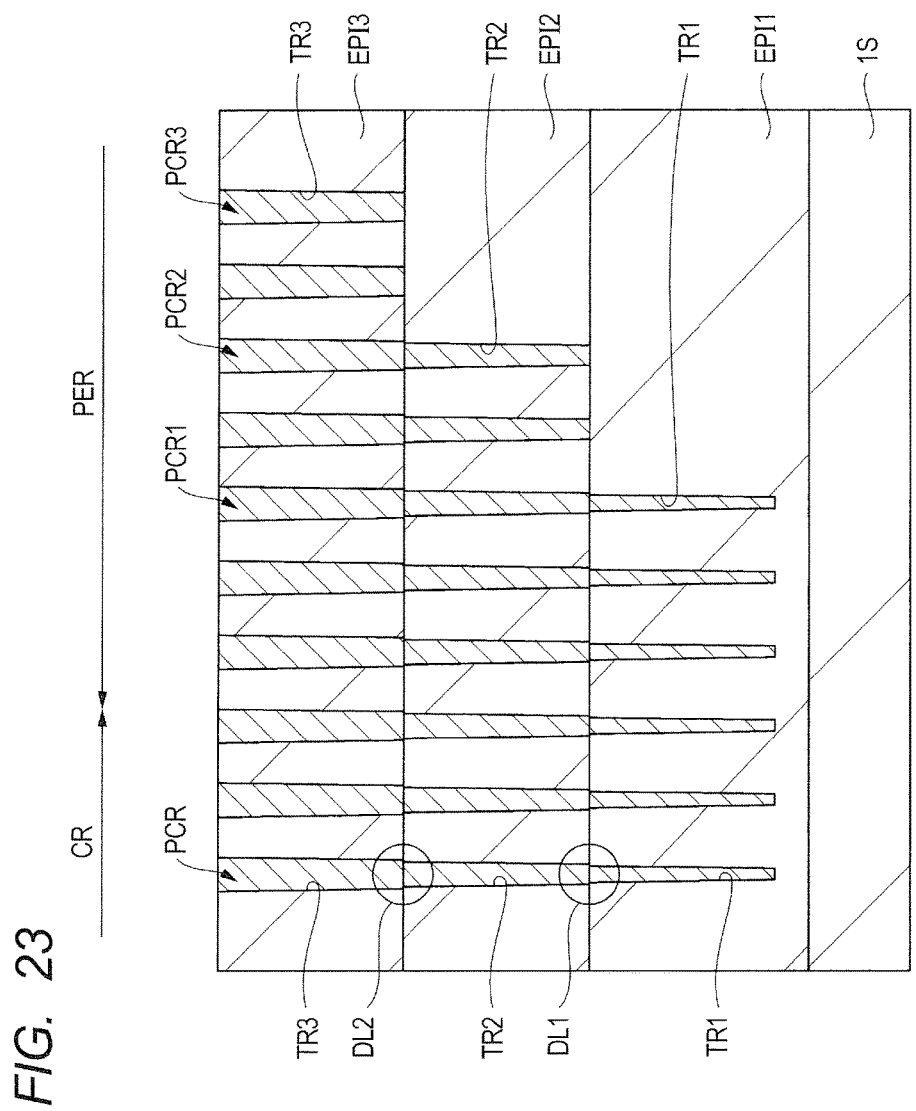
FIG. 23 is a sectional view illustrating a super junction structure of a third embodiment.

FIG. 23 is a sectional view illustrating a super junction structure of a third embodiment. For example, the characteristic point of the third embodiment shown in FIG. 23 is that the peripheral region PER has p-type column regions (PCR1, PCR2, PCR3) having different bottom positions. Specifically, the peripheral region PER includes the p-type column regions PCR1 each having the bottom located at a first position (the bottom position of the trench TR1), the p-type column regions PCR2 each having the bottom located at a second position (the bottom position of the trench TR2) shallower than the first position, and the p-type column regions PCR3 each having the bottom located at a third position (the bottom position of the trench TR3) shallower than the second position. The p-type column regions PCR2 are each disposed at a position more distant from the cell region CR than the p-type column regions PCR1. The p-type column regions PCR3 are each disposed at a position more distant from the cell region CR than the p-type column regions PCR2.

Consequently, the super junction structure of the third embodiment can relax the field strength of a region having a high field strength in the peripheral region PER. Specifically, FIG. 24A is a schematic illustration of a super junction structure, in which bottom positions of the p-type column regions PCR provided in the peripheral region PER are all equal to the bottom positions of the p-type column regions PCR provided in the cell region CR. FIG. 24A shows that a high-field-strength region EF1 having a high field strength exists in the peripheral region PER. This is probably because the p-type column regions PCR are evenly disposed in the peripheral region PER.

In the third embodiment, therefore, a consideration is given to the disposition of the p-type column regions PCR in the peripheral region PER. Specifically, FIG. 24B is a schematic illustration of the super junction structure of the third embodiment. FIG. 24B shows that the super junction structure of the third embodiment has the characteristic point that the peripheral region PER includes the p-type column regions (PCR1, PCR2, PCR3) having different bottom positions. Specifically, in FIG. 24B, the p-type column regions PCR2 are each disposed at a position more distant from the cell region CR than the p-type column regions PCR1 each having a relatively deep bottom position. The p-type column regions PCR3 are each disposed at a position more distant from the cell region CR than the p-type column regions PCR2 each having a relatively deep bottom position. FIG. 24B reveals formation of a field-strength region EF2 having a lower field strength than the high-field-strength region EF1 illustrated in FIG. 24A, showing relaxation of field strength. In this way, the super junction structure of the third embodiment increases the withstand voltage of the peripheral region PER.

For example, for the trench fill process, the trench shape cannot be varied between the cell region and the peripheral region; hence, the trench is formed in light of optimizing the withstand voltage of the cell region. In such a case, however, as illustrated in FIG. 24A, the withstand voltage of the peripheral region is not necessarily optimized. In other words, the optimization condition of the withstand voltage is different between the cell region and the peripheral region. Thus, for the trench fill process, it is difficult to individually optimize the withstand voltage of each of the cell region and the peripheral region, leading to a low degree of freedom in design of withstand voltage.

In this regard, for the multi-trench fill process of the third embodiment, the epitaxial layer is dividedly formed in layers, and when each of the layers has been formed, the trenches are formed in that layer. Hence, for example, the multi-trench fill process makes it possible to form the trenches in any of the layers in the cell region in light of optimizing the withstand voltage of the cell region, and form the trenches in some of the layers in the peripheral region. As a result, the multi-trench fill process of the third embodiment makes it possible to manufacture the super junction structure as illustrated in FIG. 23. Consequently, the multi-trench fill process of the third embodiment allows the structure of the p-type column region to be varied between the cell region and the peripheral region, which makes it easy to optimize the withstand voltage for each of the cell region and the peripheral region. That is, the third embodiment advantageously increases the degree of freedom in design of withstand voltage of each of the cell region and the peripheral region.

The multi-trench fill process of the third embodiment is summarized as follows. Specifically, the multi-trench fill process of the third embodiment includes a step of providing a semiconductor substrate having the cell region and the peripheral region as an outer region of the cell region, a step of forming a first epitaxial layer on the main surface of the semiconductor substrate, and a step of forming first trenches in the first epitaxial layer in the cell region. In addition, the multi-trench fill process of the third embodiment includes a step of filling the first trenches with a semiconductor material, and a step of forming a second epitaxial layer on the first epitaxial layer in each of the cell region and the peripheral region. In addition, the multi-trench fill process of the third embodiment includes a step of forming second trenches that are planarly superposed on the first trenches and connected therewith, and forming third trenches in the second epitaxial layer in the peripheral region. The multi-trench fill process of the third embodiment further includes a step of filling the second trenches in the cell region with a semiconductor material and filling the third trenches in the peripheral region with the semiconductor material, and a step of forming the element section on the second epitaxial layer in the cell region.

Consequently, the multi-trench fill process of the third embodiment allows the structure of the p-type column region to be varied between the cell region and the peripheral region, making it possible to increase the degree of freedom in design of withstand voltage for each of the cell region and the peripheral region.

Fourth Embodiment

Figure 25:
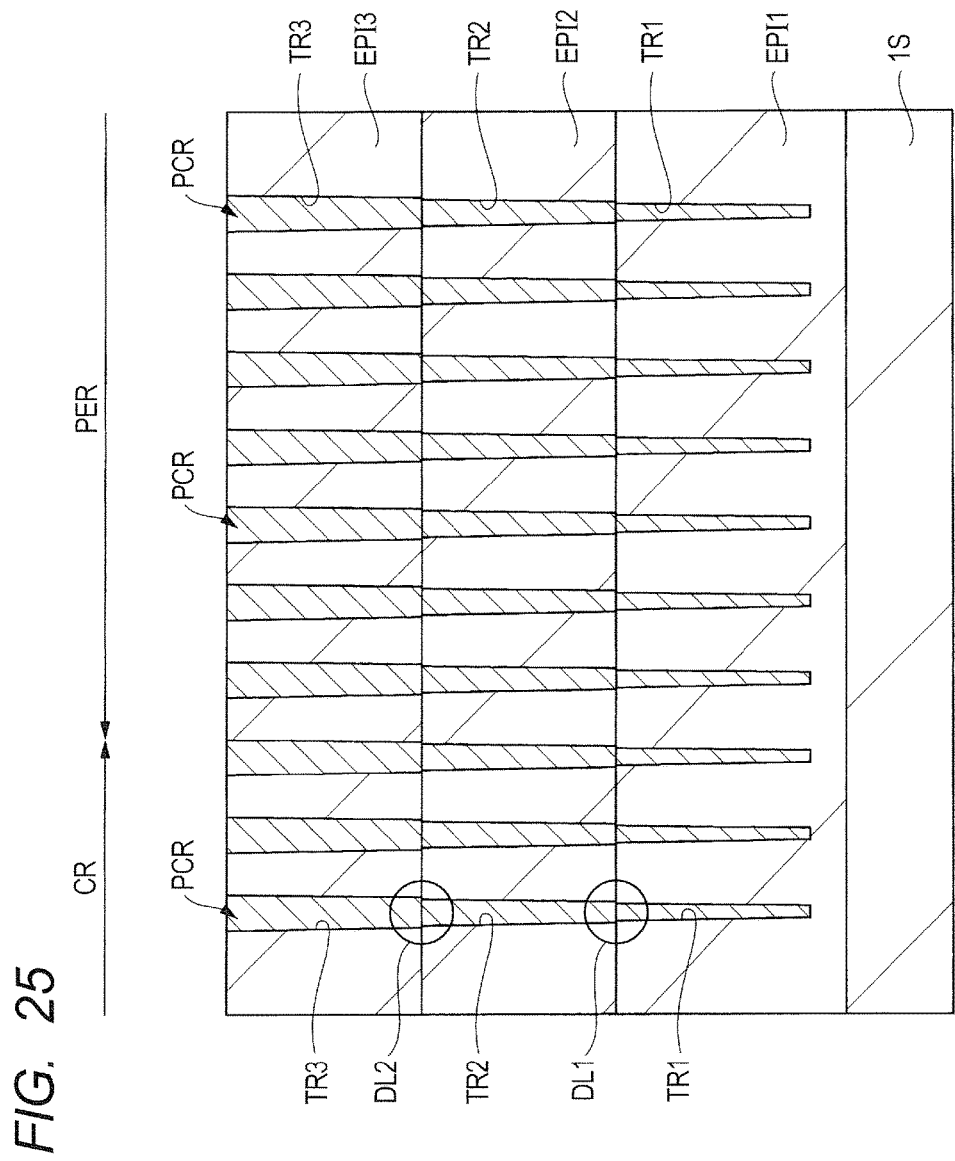
FIG. 25 is a sectional view illustrating a super junction structure of a fourth embodiment.

FIG. 25 is a sectional view illustrating a super junction structure of a fourth embodiment. The characteristic point of the fourth embodiment shown in FIG. 25 is that the epitaxial layer EPI1, the epitaxial layer EPI2, and the epitaxial layer EPI3 have different impurity concentrations from one another. Specifically, for example, the super junction structure of the fourth embodiment illustrated in FIG. 25 includes the epitaxial layer EPI1 lower than a depth position of the level difference DL1, the epitaxial layer EPI2 upper than the depth position of the level difference DL1 and lower than a depth position of the level difference DL2, and the epitaxial layer EPI3 upper than the depth position of the level difference DL2. The impurity concentrations of the epitaxial layer EPI1, the epitaxial layer EPI2, and the epitaxial layer EPI3 are different from one another.

Figure 26:
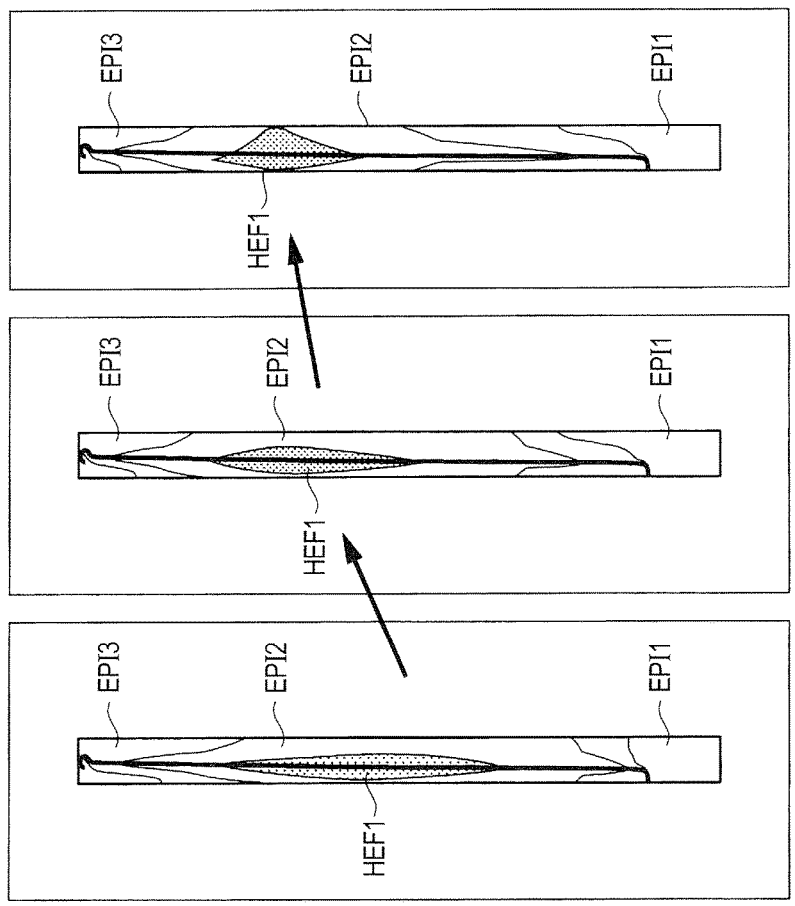
FIG. 26A illustrates a simulation result for a plurality of epitaxial layers having the same impurity concentration.
FIGS. 26B and 26C each illustrate a simulation result for a plurality of epitaxial layers having different impurity concentrations.

This increases the degree of freedom in design of withstand voltage of the super junction structure. For example, FIGS. 26A to 26C illustrate simulation results showing field strength distributions for the epitaxial layers EPI1 to EPI3 having different impurity concentrations. FIG. 26A illustrates a simulation result for the epitaxial layers EPI1 to EPI3 each having an impurity concentration of $2.25 \times 10^{15}/\text{cm}^3$. FIG. 26B illustrates a simulation result for the epitaxial layers EPI1 and EPI3 each having an impurity concentration of $2.25 \times 10^{15}/\text{cm}^3$ and the epitaxial layer EPI2 having an impurity concentration of $2.55 \times 10^{15}/\text{cm}^3$. FIG. 26C illustrates a simulation result for the epitaxial layers EPI1 and EPI3 each having an impurity concentration of $2.25 \times 10^{15}/\text{cm}^3$ and the epitaxial layer EPI2 having an impurity concentration of $2.85 \times 10^{15}/\text{cm}^3$. FIGS. 26A to 26C show that varying the impurity concentration of the epitaxial layer EPI2 varies the position of a high-field-strength region HEF1 and field strength distribution. This means that varying the impurity concentration of each of the epitaxial layers EPI1 to EPI3 varies the field strength distribution, which in turn varies the withstand voltage. Hence, in the fourth embodiment, the withstand voltage can be varied by varying the impurity concentration of each of the epitaxial layers EPI1 to EPI3. This means an increase in degree of freedom in design of withstand voltage of the cell region. Specifically, in the fourth embodiment shown in FIG. 25, the degree of freedom in design of withstand voltage of the cell region can be varied not only through design of withstand voltage based on the shape of the p-type column region PCR, but also through design of withstand voltage based on the impurity concentration of each of the epitaxial layers EPI1 to EPI3, leading to a high degree of freedom in design of the super junction structure of the fourth embodiment.

Although the fourth embodiment is described with an exemplary configuration where the impurity concentration of each of the epitaxial layers EPI1 to EPI3 is varied, the impurity concentration of the semiconductor material filling the trenches formed in each of the epitaxial layers EPI1 to EPI3 may be varied. For example, in the case of a 600 V-rating product, for the trench depth of about 50 µm, the impurity concentration of each of the epitaxial layers EPI1 to EPI3 is desirably set within a range from $2.0 \times 10^{15}$ ($1/\text{cm}^3$) to $6.0 \times 10^{15}$ ($1/\text{cm}^3$). On the other hand, the impurity concentration of the semiconductor material filling the trenches is desirably set within a range from $4.0 \times 10^{15}$ ($1/\text{cm}^3$) to $1.0 \times 10^{16}$ ($1/\text{cm}^3$).

For example, in the case of a 900 V-rating product, for the trench depth of about 90 µm, the impurity concentration of each of the epitaxial layers EPI1 to EPI3 is desirably set within a range from $5.0 \times 10^{14}$ ($1/\text{cm}^3$) to $3.0 \times 10^{15}$ ($1/\text{cm}^3$). On the other hand, the impurity concentration of the semiconductor material (p-type semiconductor material) filling the trenches is desirably set within a range from $1.0 \times 10^{15}$ ($1/\text{cm}^3$) to $5.0 \times 10^{16}$ ($1/\text{cm}^3$).

Modification

Figure 27:
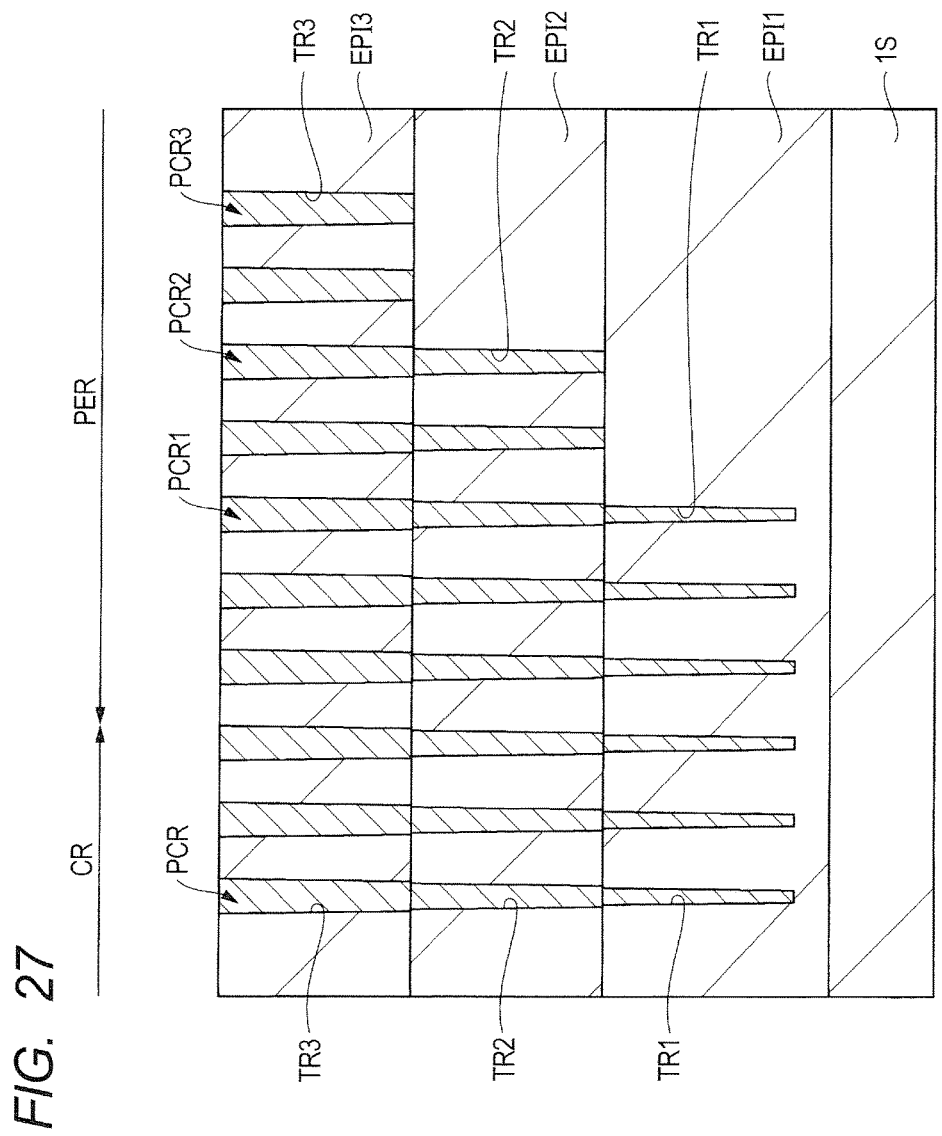
FIG. 27 is a sectional view illustrating a super junction structure of a modification.

FIG. 27 is a sectional view illustrating a super junction structure of a second modification. The super junction structure of the second modification illustrated in FIG. 27 corresponds to a combination of the characteristic point of the third embodiment and the characteristic point of the fourth embodiment. Specifically, in the second modification, the impurity concentration of each of the epitaxial layers EPI1 to EPI3 is varied, and the peripheral region PER includes the p-type column regions (PCR1, PCR2, PCR3) having different bottom positions. This further increases the degree of freedom in design of withstand voltage. For example, in FIG. 27, a formation pattern of the p-type column regions PCR is varied while the impurity concentration of each of the epitaxial layers EPI1 to EPI3 is varied in the cell region CR, thereby the withstand voltage of the cell region CR can be optimized. In addition, a formation pattern of the p-type column regions (PCR1, PCR2, PCR3) having different bottom positions is designed for the peripheral region PER, thereby the withstand voltage of the peripheral region PER can be optimized.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Although the above-described embodiments have been described with the case where the three epitaxial layers EPI1 to EPI3 are stacked as an example of the multi-trench fill process, the technical idea of the embodiments is not limited thereto, and can be applied to the case where two epitaxial layers are stacked and to the case where at least four epitaxial layers are stacked.

What is claimed is:
1. A method of manufacturing a semiconductor device, comprising the steps of:
    (a) forming a first epitaxial layer of a first conductivity type over a semiconductor substrate;
    (b) forming a first trench in the first epitaxial layer;
    (c) filling the first trench with a semiconductor material of a second conductivity type opposite to the first conductivity type;

(d) after the step (c), forming a second epitaxial layer of the first conductivity type over the first epitaxial layer including the first trench filled with the semiconductor material;

(e) forming a second trench in the second epitaxial layer, the second trench being planarly superposed on the first trench and connected with the first trench;

(f) filling the second trench with the semiconductor material of the second conductivity type; and (g) after the step (f), forming an element section over the second epitaxial layer.

2. The method according to claim 1, wherein an aspect ratio of the first trench is larger than an aspect ratio of the second trench.

3. The method according to claim 1, wherein an aspect ratio of the first trench is equal to an aspect ratio of the second trench.

4. The method according to claim 1, wherein impurity concentration of the first epitaxial layer is different from impurity concentration of the second epitaxial layer.

5. A method of manufacturing a semiconductor device, comprising the steps of:

(a) providing a semiconductor substrate having a cell region and a peripheral region as an outer region of the cell region;

(b) forming a first epitaxial layer of a first conductivity type over a main surface of the semiconductor substrate;

(c) forming a first trench in the first epitaxial layer in the cell region;

(d) filling the first trench with a semiconductor material of a second conductivity type opposite to the first conductivity type;

(e) after the step (d), forming a second epitaxial layer of the first conductivity type over the first epitaxial layer in each of the cell region and the peripheral region;

(f) forming a second trench that is planarly superposed on the first trench and connected with the first trench, and forming a third trench in the second epitaxial layer in the peripheral region;

(g) filling the second trench in the cell region with a semiconductor material of the second conductivity type and filling the third trench in the peripheral region with the semiconductor material of the second conductivity type; and (h) after the step (g), forming an element section over the second epitaxial layer in the cell region.

* * * * *